(12) United States Patent
Fujima

(10) Patent No.: US 6,282,147 B1
(45) Date of Patent: Aug. 28, 2001

(54) SEMICONDUCTOR MEMORY DEVICE HAVING WORD LINES DRIVEN BY ROW SELECTING SIGNAL AND COLUMN SELECTING SIGNAL LINES ARRANGED PARALLEL TO EACH OTHER

(75) Inventor: Shiro Fujima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/528,446

(22) Filed: Mar. 17, 2000

(30) Foreign Application Priority Data

Mar. 31, 1999 (JP) .................................... 11-094203

(51) Int. Cl.[7] ................. G11C 8/00; G11C 5/02
(52) U.S. Cl. .................. 365/230.06; 365/51; 365/63
(58) Field of Search ................. 365/51, 63, 230.03, 365/230.06

(56) References Cited

U.S. PATENT DOCUMENTS

| | | | |
|---|---|---|---|
| 4,901,285 | * 2/1990 | Sano et al. .................. | 365/230.01 |
| 5,406,526 | * 4/1995 | Sugibayashi et al. .......... | 365/230.03 |
| 5,468,985 | * 11/1995 | Harima ..................... | 365/214 |
| 5,485,426 | * 1/1996 | Lee et al. .................. | 365/203 |
| 5,717,645 | * 2/1998 | Kengeri et al. .............. | 365/230.01 |
| 5,970,016 | * 10/1999 | Ohsawa ..................... | 365/230.03 |

* cited by examiner

*Primary Examiner*—Son Mai
(74) *Attorney, Agent, or Firm*—Young & Thompson

(57) ABSTRACT

A semiconductor memory device having a plurality of memory blocks, each block including a plurality of memory banks, which can be accurately operated with high speed, and which consumes less power. The device includes a row decoding section for decoding the row address to generate a row selecting signal, and a column decoding section, adjacent to the row decoding section, for decoding the column address to generate a column selecting signal. The word lines driven by the row selecting signal and column selecting signal lines for outputting the column selecting signal are arranged parallel to each other to supply these signals to the memory block of a target memory cell and to access the memory cell.

15 Claims, 16 Drawing Sheets

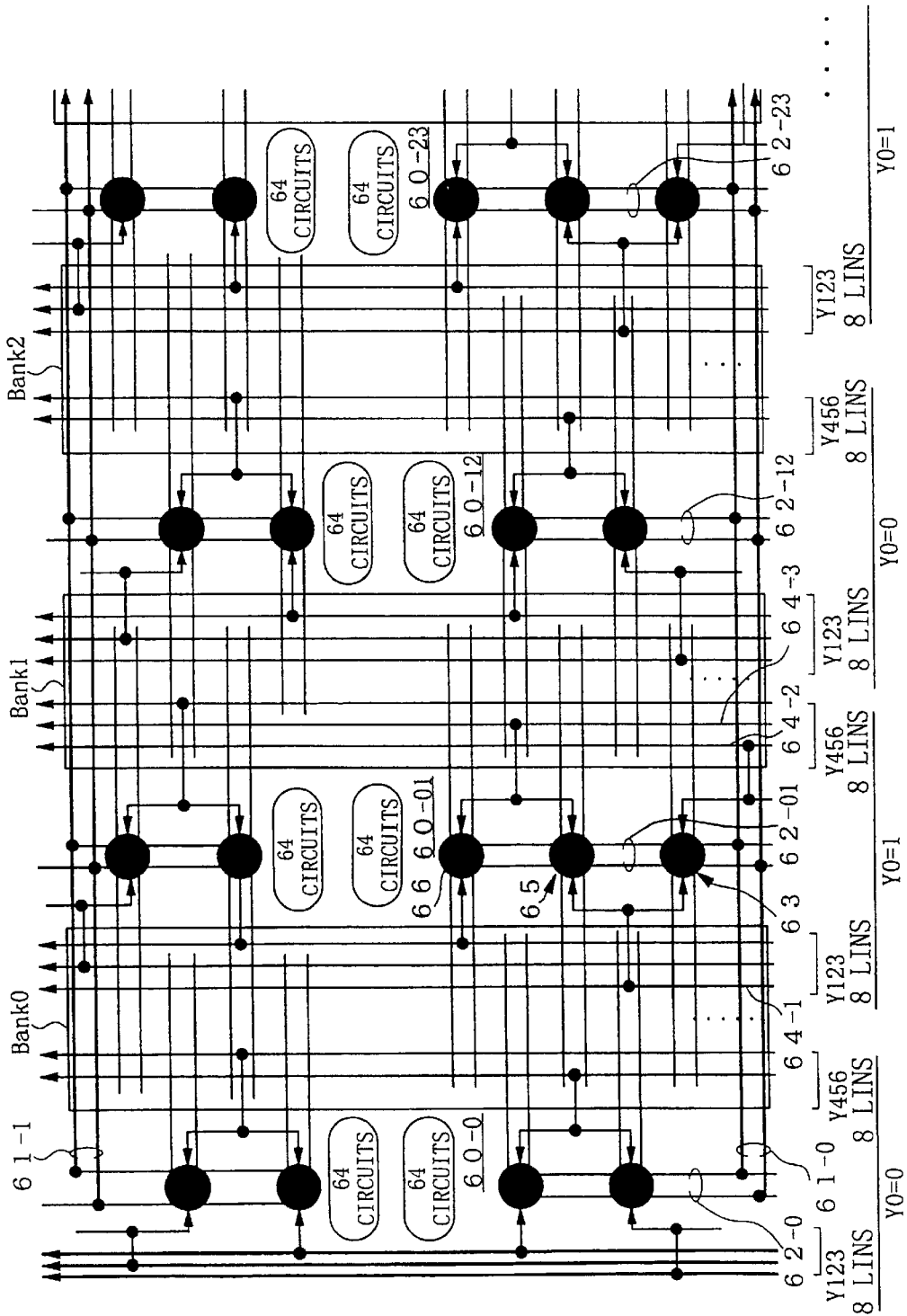

US 6,282,147 B1

SEMICONDUCTOR MEMORY DEVICE HAVING WORD LINES DRIVEN BY ROW SELECTING SIGNAL AND COLUMN SELECTING SIGNAL LINES ARRANGED PARALLEL TO EACH OTHER

BACKGROUND OF THE INVENTION

1. Field of the Invention

The present invention relates to a semiconductor memory device including a plurality of memory banks (i.e., storage units which are individually controlled), in particular, one having a plurality of memory blocks each of which includes a plurality of memory banks.

This application is based on Patent Application No. Hei 11-94203 filed in Japan, the contents of which are incorporated herein by reference.

2. Description of the Related Art

FIG. 12 shows the general structure of a conventional semiconductor memory device. In the following explanations, it is assumed for convenience that the semiconductor memory device is a DRAM (dynamic random access memory) having a storage capacity of 256 Mbit. This semiconductor memory device consists of 32 banks indicated by reference numerals Ba0 to Ba31 in FIG. 12. That is, in comparison with the SDRAM (synchronous DRAM) which generally consists of 4 banks or the like, the memory device shown in FIG. 12 includes a larger number of banks. The reason for dividing the whole memory area into a plurality of banks follows: In the DRAM or the like, the operation of storing or deleting data in or from the internal memory cells is performed using the charge or discharge process; thus, the operation speed in the semiconductor memory device cannot be as high as the transfer speed of the bus connected to the memory device. Therefore, the memory cell array in the semiconductor memory device is divided into a plurality of banks so as to perform a parallel process, thereby virtually performing a high-speed operation having a speed as high as the bus operation.

Each bank can be regarded as a logically independent memory, and as explained above, while the banks are activated in turn, serial data input/output operation is performed with respect to each target cell, thereby realizing a high-speed general operation. As with general DRAMs, the semiconductor memory device shown in FIG. 12 has a two-dimensional memory cell arrangement. In order to designate one of the memory cell arrays, the address signal supplied to the semiconductor memory device includes a bank address for designating a bank, a row address for designating a row in the X direction, and a column address for designating a column in the Y direction. The upper portion of the address signal is assigned to the bank address. The target memory cell is accessed by designating the target bank using the bank address, and then designating the memory cell using the row and column addresses.

More specifically, the semiconductor memory device shown in FIG. 12 has 4 blocks, each consisting of 32 banks. For example, the areas indicated by reference numerals 1-1 and 1-2 form a single block. In area 1-1 or 1-2, 32 Mbit (256 Mbit/8) memory cells are integrated, and each area is called a "memory cell array block" in the following explanations. Memory cell array blocks 1-1 and 1-2, 1-3 and 1-4, 1-5 and 1-6, and 1-7 and 1-8 respectively form pairs, and 32 banks Ba0 to Ba31 are assigned to each pair.

Each memory cell array block has a "×4 bit" structure. When a specific address is designated or read out, 32 bit data is output from 32 I/O lines. In FIG. 12, each arrow indicates "4 I/O", and eight "4 I/O" (i.e., 4 I/O×8) arrows output from each memory cell array block indicates the above operation. Accordingly, if data is read out from a bank of the memory cell array blocks 1-1 and 1-2, a 32 bit data is output in total. The 32 bit data is then parallel-serial converted. The data from the memory cell array blocks 1-1 and 1-2 is combined with a 32 bit data from the memory cell array blocks 1-5 and 1-6, so that a 8 DQ×8 cycle data is output via circuit block 6 (explained later) to the outside of the device. A similar operation is performed in the memory cell array blocks 1-3 and 1-4 and the memory cell array blocks 1-7 and 1-8.

Circuit blocks 2-1 to 2-4 are provided between the two memory cell array blocks of each of 4 pairs. Each circuit block comprises a data amplifier (see "DA" in FIG. 12) for amplifying data read out from the memory cell array via a sense amplifier (not shown) and the like, a write amplifier (see "WA" in FIG. 12) used when data is written in the memory cell array, a column decoder for decoding the column address of the relevant memory cell array block, and so on.

Reference numerals 3-1 to 3-8 indicate row decoders (see "Row Dec." in FIG. 12) for decoding the row address in the address signal and outputting a decoded signal obtained by the decoding operation. These row decoders 3-1 to 3-8 correspond to each memory cell array block.

The circuit blocks 4-1 and 4-2 are arranged in the upper and lower sides of circuit blocks 5 to 7 (explained later). Each of the circuit blocks 4-1 and 4-2 comprises row pre-decoding circuit (see "Row pre dec." in FIG. 12) for pre-decoding the row address before the decoding operation of the row decoder, and a redundancy circuit (see "Row red." in FIG. 12) for performing a redundancy process for recovering a disordered memory cell array in the row direction.

The circuit block 5 comprises a booster circuit (see "Vboot" in FIG. 12) generally used when the word line is activated, a fuse (see "Fuse" in FIG. 12) used for the redundancy process, a reference potential generating circuit (see "Vref" in FIG. 12) for generating a reference potential used for reducing the internal voltage, and so on.

The circuit block 6 comprises an input/output interface circuit (see "I/F" in FIG. 12), a circuit for adjusting the skew of the clock used in the semiconductor memory device (see "DLL (delayed lock loop)" in FIG. 12), a known input/output pad (see "Bonding Pad" in FIG. 12), and so on.

The circuit block 7 comprises the above "Vboot", "Fuse", and a circuit for generating a substrate potential (see "BBG (back bias generator)" in FIG. 12), and so on.

FIG. 13 is an enlarged view showing the circuit related to memory cell array block 1-1. In a general SDRAM or the like, the row decoder, column decoder, sense amplifier, and the like are separately provided for each bank. In contrast, in the semiconductor memory device as shown in FIGS. 12 and 13, a row decoder is provided for 16 banks (i.e., Ba0 to Ba15, or Ba16 to Ba31). Additionally, as shown in FIG. 13, sense amplifier area 10 is provided between the banks. In the area 10, a sense amplifier (may be abbreviated as "S/A", hereinbelow) for reading out data from the memory cell array, and the like are provided.

A bank selecting logic circuit (not shown) is provided close to the row decoder 11. The column bank selecting signals CBS0 to CBS15 generated by the bank selecting logic circuit are respectively supplied to the banks Bank0 to Bank15, and each bank selecting signal can be independently made effective, thereby activating the corresponding bank. The bank selecting logic circuit is provided in the circuit blocks 4-1 and 4-2 shown in FIG. 12. When the bank Bank1 is being activated, the bank selecting operation using the bank selecting signals CBS1 is performed in the sense amplifier areas adjacent to Bank1. These column bank selecting signals CBS0 to CBS15 can be obtained by decoding the bank address included in the above-explained address signal. As later explained, each column bank selecting signal uses two signal lines (inverted/non-inverted); however, a single signal line is described in FIG. 13 for convenience.

The row decoder 11 decodes the row address included in the address signal, thereby selecting one of the word lines WL indicated by broken lines in FIG. 13. The column decoder 12 decodes all bits (7 bits in the later-explained embodiment of the present invention) of the column address included in the address signal, thereby selecting one of column selecting signals YSW (indicated by thick lines in FIG. 13) by using a column switch (not shown) corresponding to each signal. Accordingly, a memory cell is selected by using the bank address, row address, and column address included in the designated address signal.

Here, the memory cell array block 1-2 has a structure similar to that of the memory cell array block 1-1, where the differences are (i) banks Bank16 (i.e., Ba16) to Bank31 (i.e., Ba31) are included (the block 1-1 includes banks Bank0 (i.e., Ba0) to Bank15 (i.e., Ba15)), and (ii) the blocks 1-1 and 1-2 have a mirror-image arrangement with respect to the "boundary" row decoder 12. In the above explanation, only the bank Bank1 is activated; however, in the actual operation, a plurality of banks may be activated in turn and the banks may be selected in turn with a specific interval. For example, first, only bank Bank0 is activated, and a memory cell in the bank is selected using the row address and column address in the designated address signal so as to input or output data, and after a specific elapsed time, bank Bank2 is also activated while the bank Bank0 is still activated, and a memory cell in Bank2 is selected.

FIG. 14 is a circuit diagram showing the structure of the column selecting circuit provided in the sense amplifier area 10 shown in FIG. 13. In FIG. 14, reference numerals 15 to 18 indicate N-channel transistors (the transistor may be abbreviated as "TR", hereinbelow), and reference symbol CBS indicates the above-explained column bank selecting signal, reference symbol CBSB indicates an inversion signal of the column bank selecting signal CBS, reference symbol YSW indicates the column selecting signal indicated by the thick lines in FIG. 13, reference symbol GND indicates the earth (or ground) potential, reference symbol D indicates a digit line connected to the sense amplifier (not shown), reference symbol DB indicates a signal line through which an inversion signal of the signal passing through the digit line D is transmitted, and reference symbols I/OT and I/ON indicate signal lines through which a signal through the I/O line connected to the I/F control circuit in circuit block 6 in FIG. 12, and an inversion signal thereof respectively pass.

According to the circuit structure as shown in FIG. 14, when the target bank is not activated and the column bank selecting signals CBS and CBSB respectively have "L" (low) and "H" (high) levels, TR15 is on (i.e., in the On state) while TR 16 is off (i.e., in the Off state). Therefore, both gates of TR 17 and TR 18 are in the "L" level, so that digit lines D and DB are not connected to signal lines I/OT and I/ON. If the target bank is being activated and the column bank selecting signal CBS and CBSB are respectively in the "H" and "L" levels, then TR 15 is off while TR 16 is on, so that the potential of the column selecting signal YSW is applied to the gates of TR 17 and TR18. In this operation, if the column corresponding to the column selecting circuit is being selected, the level of the column selecting signal YSW becomes high and both TR17 and TR18 are on. As a result, the digit lines D and DB are respectively connected to signal lines I/OT and I/ON, so that the potential of the bit line with respect to each of the digit lines D and DB is transmitted to the relevant I/O line and is output to the outside of the semiconductor memory device.

As explained above, in a conventional semiconductor memory device, the column decoder 12 is used in common by 16 banks. In addition, the column selecting signal YSW is also arranged over a plurality of banks on the memory cell plate, that is, the signal YSW is also used in common by those banks. Accordingly, when a column is selected using the column selecting signal YSW, the word line WL selected by the row decoder 11 is activated in all 16 banks. Therefore, one of the column bank selecting signals CBS0 to CBS15 is made effective, thereby further selecting one of the 16 banks, which is subjected to the data input/output operation. Therefore, in the conventional semiconductor memory device, the column bank selecting signal line is arranged in the sense amplifier area 10. However, in such an arrangement, the sense amplifier area 10 must be larger, and thus the total area of the chip is increased.

The conventional column selecting circuit as shown in FIG. 14 has the following problem. In the circuit, when the column bank selecting signal CBS is "H", the signal level thereof must be higher than the power supply voltage Vcc (not shown) which is generated inside the semiconductor memory device. If this condition is not satisfied, when the column selecting signal YSW is decreased to the power supply voltage Vcc according to the voltage drop caused by TR16, signal transmission to the gates of TR17 and TR18 may fail.

In order to prevent such a problem, in the conventional semiconductor memory device, the levels of the column bank selecting signals CBS and CBSB are set higher than the level of the power supply voltage Vcc. As the power source to satisfy this condition, the above-described booster circuit (see "Vboot" in FIG. 12) is used. However, the booster circuit Vboot is originally used only for boosting the word line; thus, to use the booster circuit for another use increases power consumption, and the boosting capability of the booster circuit has a limit.

Additionally, in the conventional semiconductor memory device, the arrangement of the column selecting signal YSW lines and the I/O lines causes the following problem. FIG. 15 is a diagram for explaining this problem. This diagram is an enlarged view of the neighboring area (as shown in FIG. 13) of the memory cell array block 1-1 shown in FIG. 12. In the figure, data amplifier 19 (see "DAMP" in FIG. 15) relates to the structure of FIG. 12, and is provided for amplifying the signal level of data read out to the I/O lines (i.e., I/OT and I/ON) from the sense amplifier (not shown).

As shown in FIG. 15, in the conventional semiconductor memory device, the column selecting signal YSW lines and I/O lines are arranged parallel to each other, more specifically, parallel metallic wiring lines are arranged in a layer over a long distance (actually, approximately 4 to 5 mm) from the column decoder 12 to the left end (the bank Bank0 side) of the memory cell array block. In such an arrangement, the crosstalk due to the coupling of the wiring between the lines (i.e., capacitance C in the same wiring layer in FIG. 15) cannot be disregarded.

The above problem will be further explained in detail. It is assumed that the word line WL connected to a memory cell is activated and the sense amplifier for sensing data stored in the relevant memory cell is activated, and the stored data is amplified by the sense amplifier and is output to digit lines D and DB (see FIG. 14). In the next step, the column corresponding to the memory cell is selected, and the level of the column selecting signal YSW is changed from "L" to "H". Simultaneously, the digit lines D and DB are connected to the I/O lines (i.e., signal lines I/OT and I/ON) according to the function of the column selecting circuit shown in FIG. 14, and data on the digit lines D and DB is transmitted to the I/O lines so that the signal level of each I/O line is changed. Accordingly, the data amplifier 19 shown in FIG. 15 receives a difference potential between the signal lines I/OT and I/ON (functioning as the I/O lines) and further amplifies this potential.

The above I/O lines are arranged over a long length from an end of the memory cell array block (i.e., the bank Bank0 side in FIG. 15) to the other end (i.e., the data amplifier 19 side); thus, the length of the wiring is long and its load capacity is large. Therefore, the signal level of each I/O line input into the data amplifier 19 is very small, and the data reading period is short. On the other hand, the amplitude of the column selecting signal YSW is larger than the amplitude of the data on the I/O lines. Therefore, if the column selecting signal YSW is changed when the data signal on the I/O lines rises, then the crosstalk due to the column selecting signal YSW directly affects the I/O lines. That is, even when the signal lines I/ON and I/OT are preferably balanced, the crosstalk may affect the signal lines and causes an undesirable change of the signal lines. Therefore, the data output from the data amplifier 19 may be delayed, and the data amplifier 13 may read erroneous data according to the delay.

In order to prevent the above problem, the crosstalk due to the coupling between the column selecting signal YSW lines and the I/O lines should be prevented as much as possible. For example, the resistance of the column selecting signal YSW lines and the I/O lines may be decreased. However, in this case, the wiring line would have to be thicker and thus the spacing between the wiring lines should be narrower; thus, a specific pitch of the wiring lines cannot be obtained. Therefore, this example for solving the above problem is not preferable in practice.

Additionally, in the conventional arrangement as shown in FIG. 15, the I/O lines are connected via column decoder 12 to data amplifier 19; thus, the layout design (for making a mask) in the vicinity of the column decoder 12 is difficult. For example, it may be difficult to make the I/O lines pass through the column decoder 12 according to a layout design. In such a case, the I/O lines should make a detour, thereby requiring a larger width or area for wiring. In addition, as explained above, four pairs of I/O lines (i.e., 8 I/O lines) are output from the memory cell array block; thus, the above-described problem is much more serious. That is, the conventional arrangement has a serious problem from the viewpoint of the layout.

The conventional semiconductor memory device also has the following problem. FIG. 16 is a diagram for explaining the problem.

The word lines WL indicated by broken lines in the figure are the same lines as shown in FIG. 13, and "SAA" indicates a signal line of the sense amplifier activating signal for making the sense amplifier (not shown) start the data sensing operation. Here, a timing limit is present between the sense amplifier activating signal SAA and the column selecting signal YSW. It is assumed that the word line WL is activated and the relevant sense amplifier is activated using the sense amplifier activating signal SAA. Under these conditions, if the column selecting signal YSW is made effective (so as to obtain a sensed result) even though the signal potential of the data output onto the digit lines D and DB (see FIG. 14) has not been sufficiently changed, a problem may occur, for example, the potential of the signal on the digit lines D and DB may be inverted. Therefore, the timing between the sense amplifier activating signal SAA and the column selecting signal YSW should be adjusted so as to make the column selecting signal YSW effective after the data of the memory cell is sufficiently sensed.

As shown in FIG. 16, in the conventional semiconductor memory device, the word lines WL and the sense amplifier activating signal SAA lines indicated by the broken lines are arranged parallel to each other (i.e., along the vertical direction in the figure). As for the delay on the wiring lines, elliptic area A16 lastly receives the signal for driving the word line and the sense amplifier activating signals SAA when observed from the row decoder 11 side. That is, this area A16 is the far end of the word line and the far end of the sensing operation signal. On the other hand, area B16 is the first area which receives the above signals. That is, this area B16 is the near end of the word line and the near end of the sensing operation signal. In addition, when observed from the column decoder 12, area B16 lastly receives the column selecting signal YSW (that is, this area is the far end of the column selecting signal YSW). On the other hand, area A16 first receives the column selecting signal YSW (that is, this area is the near end of the column selecting signal YSW).

That is, the area A16 lastly receives the sense amplifier activating signal SAA and first receives the column selecting signal YSW, so that the period from the time when the sense amplifier activating signal SAA is activated to the time when the column selecting signal YSW is activated is shortest. Therefore, the temporal margin from the time when the sense amplifier activating signal SAA becomes effective to the time when the column selecting signal YSW becomes effective must be determined based on the area A16. In contrast, the area B16 first receives the sense amplifier activating signal SAA and lastly receives the column selecting signal YSW. Therefore, if the temporal margin is designed based on the condition of area A16 as described above, then in the area B16, the column selecting signal YSW may not become effective for a long time even if the sensing operation had already been completed a sufficient time before; thus, an undesirable waiting time occurs.

As explained above, in the conventional arrangement, the period from the start of memory-cell sensing to the column selection is not fixed according to each position on the memory cell array block; thus, an extra margin is necessary, and it is difficult to operate the semiconductor memory device with high speed. If the driving capability of the driver for driving the word lines, or the like, is improved and the relevant resistance is thus lowered, the above problem related to the difference between the far and near ends can be reduced. However, the area occupied by the driver is increased in proportion with the improvement of the driving capability, and the chip size must be increased.

SUMMARY OF THE INVENTION

In consideration of the above circumstances, an objective of the present invention is to provide a semiconductor memory device which has a simplified structure including a plurality of memory blocks (each of which includes a plurality of memory banks), and which can be accurately operated with high speed, and which consumes less power.

Therefore, the present invention provides a semiconductor memory device having a plurality of memory blocks, each block including a plurality of memory banks, wherein a target memory cell in the memory blocks is accessed according to an input bank address, row address, and column address, the semiconductor memory device comprising:

a row decoding section for decoding the row address so as to generate a row selecting signal; and a column decoding section, adjacent to the row decoding section, for decoding the column address so as to generate a column selecting signal, and wherein word lines driven by the row selecting signal and column selecting signal lines for outputting the column selecting signal are arranged parallel to each other, so as to supply these signals to the memory block of the target memory cell and to access the memory cell.

In the above structure, the column selecting signal lines may be provided between the adjacent word lines.

Accordingly, it is unnecessary to arrange the column decoding section close to a data amplifier for amplifying a data signal transmitted via I/O lines from a memory cell. Therefore, the layout for a portion from the memory block to the data amplifier can be simplified.

In addition, the word lines and the column selecting signal lines may be supplied to the memory block from the same direction. Accordingly, sense amplifier activating signals, whose lines are arranged parallel to the word lines, can be supplied to the memory block in the same direction as the column selecting signal lines. As a result, the delay distribution with respect to the word lines, sense amplifier activating signals, and column selecting signals can be made uniform over the memory block, and the temporal margin from the time when the sense amplifier activating signal is made effective to the time when the column selecting signal is made effective can also be fixed over the whole chip area, thereby reducing the temporal margin in comparison with the conventional devices.

It is possible that the word lines and the column selecting signal lines are formed in the same wiring layer. Accordingly, the wiring area can be efficiently used.

In addition, each word line may have a hierarchical structure including sub word lines connected to the memory cells and a main word line which controls these sub word lines. Accordingly, the wiring pitch necessary for the sub word lines can be realized between the main word lines, thereby easily providing the column selecting signal lines between the adjacent main word lines.

The present invention also provides a semiconductor memory device having the same basic memory structure as that explained above, comprising:

a row decoding section for decoding the row address so as to generate a row selecting signal;

a column pre-decoding section for pre-decoding the column address so as to generate a column pre-decoded signal; and a column decoding section, provided in an area of the memory block where a sense amplifier for sensing the memory cell is provided, for performing the main decoding operation of the column address based on the column pre-decoded signal, and selecting the column on the memory block designated by the column address.

According to this structure, in comparison with the case of full-decoding all bits of the column address, the number of signal lines arranged in the sense amplifier area can be reduced, thereby reducing the chip area.

Typically, the column pre-decoded signal is supplied to the area where the sense amplifier is provided, for each bank. Accordingly, it is unnecessary to arrange the column selecting signal lines over a plurality of banks; thus, the column selecting operation can be individually performed in the sense amplifier area of each bank.

The present invention also provides a semiconductor memory device having a plurality of memory blocks, each block including a plurality of memory banks, comprising a connecting portion, provided on each memory cell in the memory blocks, for connecting metallic wiring layers. Preferably, the connecting portion is a through hole. Accordingly, it is possible to easily realize a structure in which the column selecting signal lines are arranged parallel to the word lines running on the memory block, and the column selecting signal lines are connected to another metallic wiring layer via through holes or the like so as to arrange these lines perpendicular to the word lines.

The present invention also provides a semiconductor memory device having a plurality of memory blocks, each block including a plurality of memory banks, wherein a target memory cell in the memory blocks is accessed via input/output lines according to an input bank address, row address, and column address, the semiconductor memory device comprising:

a row decoding section for decoding the row address so as to generate a row selecting signal; and a column decoding section for decoding the column address so as to generate a column selecting signal, and wherein column selecting signal lines for outputting the column selecting signal and the input/output lines are arranged perpendicular to each other.

Accordingly, no crosstalk caused by the coupling between the column selecting signal lines and the input/output lines occurs, and it is possible to prevent the problem of noise being included in the input/output lines according to a change of the column selecting signal lines.

The present invention also provides a semiconductor memory device having the same basic memory structure as that first explained, comprising:

a row decoding section for decoding the row address so as to generate a row selecting signal; and a column pre-decoding section for pre-decoding the column address so as to generate 2-party column pre-decoded signals; and a column decoding section, provided in an area of the memory block where a sense amplifier for sensing the memory cell is provided, for performing the main decoding operation of the column address based on the column pre-decoded signals, and selecting the column on the memory block designated by the column address, and wherein the area where the sense amplifier is provided is arranged between lines for outputting the 2-party column pre-decoded signals.

Accordingly, in comparison with the case of full-decoding all bits of the column address, the limitation of the wiring pitch of the column pre-decoded signal can be eased. In addition, in comparison with the pre-decoding arrangement of 3 or more stages (i.e., parties), the number of transistors for constructing the column decoding section can be reduced; thus, the area of the column decoding section can be reduced and an increase of the sense amplifier area can be prevented, thereby reducing the chip area. Furthermore, only two stages of transistors are necessary; thus, it is possible to prevent the problem such that data from the sense amplifier cannot be easily transmitted to input/output lines due to the "on" resistance of the transistors. In addition, even when the 2-party column pre-decoded signals are arranged in the same wiring layer, these signals cannot overlap each other; thus, this arrangement is preferable in consideration of the limitation of the wiring pitch.

Preferably, the 2-party column pre-decoded signals are supplied to the column selecting section from either side (facing each other) of the column selecting section. Therefore, in comparison with the arrangement in which the column pre-decoded signal bits are supplied from one side to the column selecting section, the limitation of the wiring pitch of the column pre-decoded signal can be eased.

The present invention also provides a semiconductor memory device having the same basic memory structure as that explained above, comprising:
- a row decoding section for decoding the row address so as to generate a row selecting signal;
- a column pre-decoding section for pre-decoding the column address and the bank address so as to generate a column pre-decoded signal; and
- a column decoding section, provided in an area of the memory block where a sense amplifier for sensing the memory cell is provided, for performing the main decoding operation of the column address based on the column pre-decoded signal, and selecting the column on the memory block designated by the column address.

Accordingly, the bank selection is also performed by the column selection section which can be arranged in the lower portion of the memory block; thus, it is unnecessary to arrange bank selecting signal lines perpendicular to the column selecting signal lines in the sense amplifier area as in conventional cases, and the sense amplifier area can be reduced, thereby reducing the overall chip area. In addition, it is unnecessary to increase the voltage of the bank selecting signal lines to a voltage exceeding the power supply voltage; thus, no boosting source is necessary for the column selecting operation. Therefore, the circuit size of the booster source can be reduced and relevant current consumption can be reduced.

BRIEF DESCRIPTION OF THE DRAWINGS

FIG. 3A is a circuit arrangement showing the logical connection relationship of the area, and FIG. 3B is a cross-sectional view of the area.

FIG. 4 is a diagram for showing the wiring arrangement of the column selecting signals on the memory cell array block in the embodiment.

DESCRIPTION OF THE PREFERRED EMBODIMENTS

Hereinafter, an embodiment according to the present invention will be explained in detail with reference to the drawings.

Figure 1:
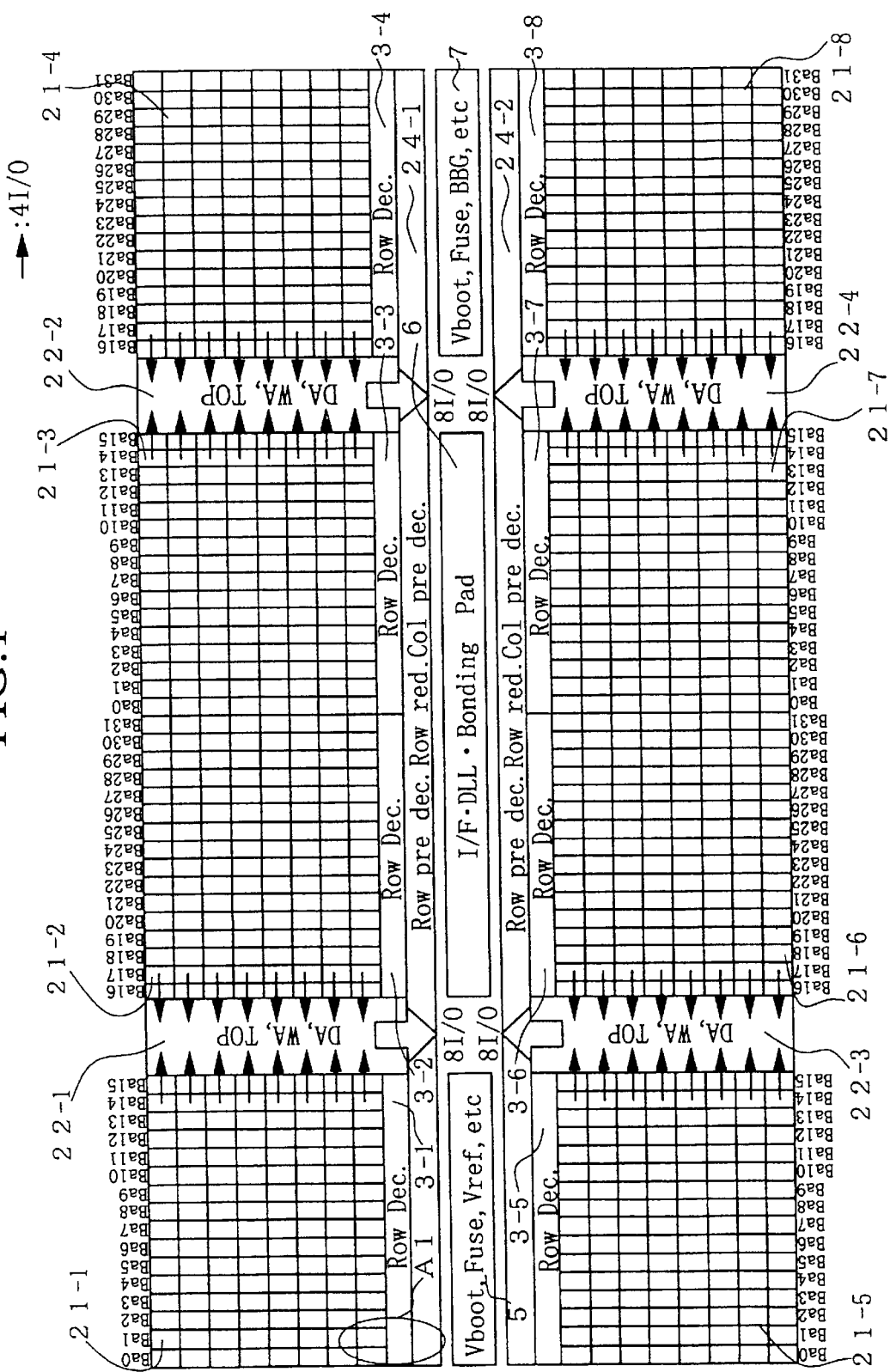
FIG. 1 is a block diagram showing the general structure of the semiconductor memory device as an embodiment according to the present invention.
Figure 12:
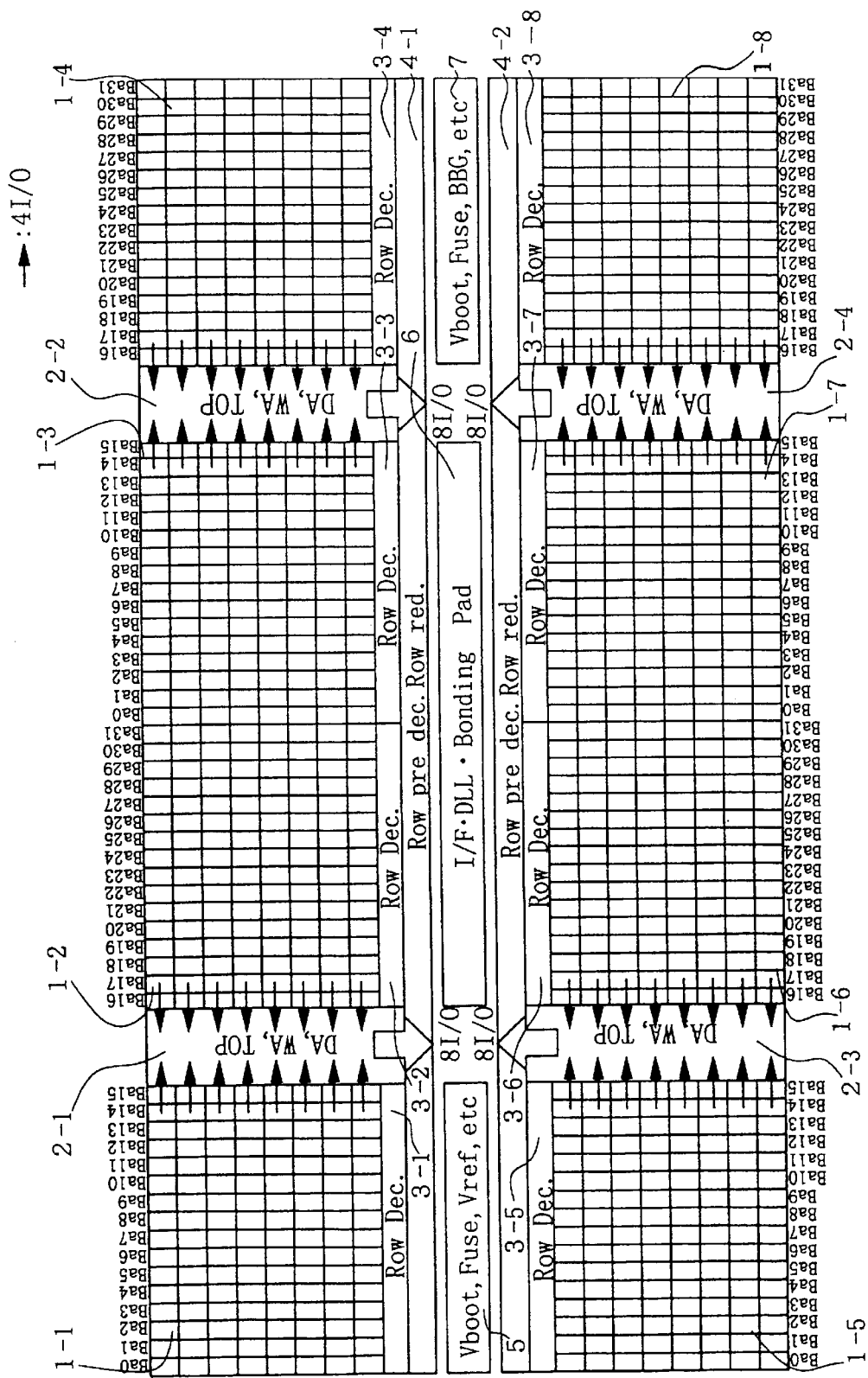
FIG. 12 is a block diagram showing the general structure of a conventional semiconductor memory device.

FIG. 1 is a diagram showing the general structure of the semiconductor memory device. In FIG. 1, parts identical to those shown in FIG. 12 are given identical reference numerals.

The distinctive feature of the present embodiment in comparison with the conventional semiconductor memory device is that the column decoder is provided in divided form near the row decoder and in the memory cell array block. In the conventional structure, the column decoder is positioned, for example, in circuit block 2-1 between the memory cell array blocks 1-1 and 1-2. That is, in the present embodiment, (i) the pre-decoding circuit (see "Col pre dec." in FIG. 1) for pre-decoding the column address is provided in the circuit blocks 24-1 and 24-2 provided in a center area of the chip, and (ii) a circuit for performing a final column-decoding operation based on the pre-decoded column address is provided in the column selecting circuit area in the memory cell array block. As for the other structural elements, the memory cell array blocks 21-1 to 21-8, circuit blocks 22-1 to 22-4, and circuit blocks 24-1 to 24-2 in the present embodiment respectively correspond to the memory cell array blocks 1-1 to 1-8, circuit blocks 2-1 to 2-4, and circuit blocks 4-1 to 4-2 in the above-described conventional example, and thus have similar functions.

Below, the distinctive feature of the semiconductor memory device of the present embodiment will be explained in more detail.

Figure 2:
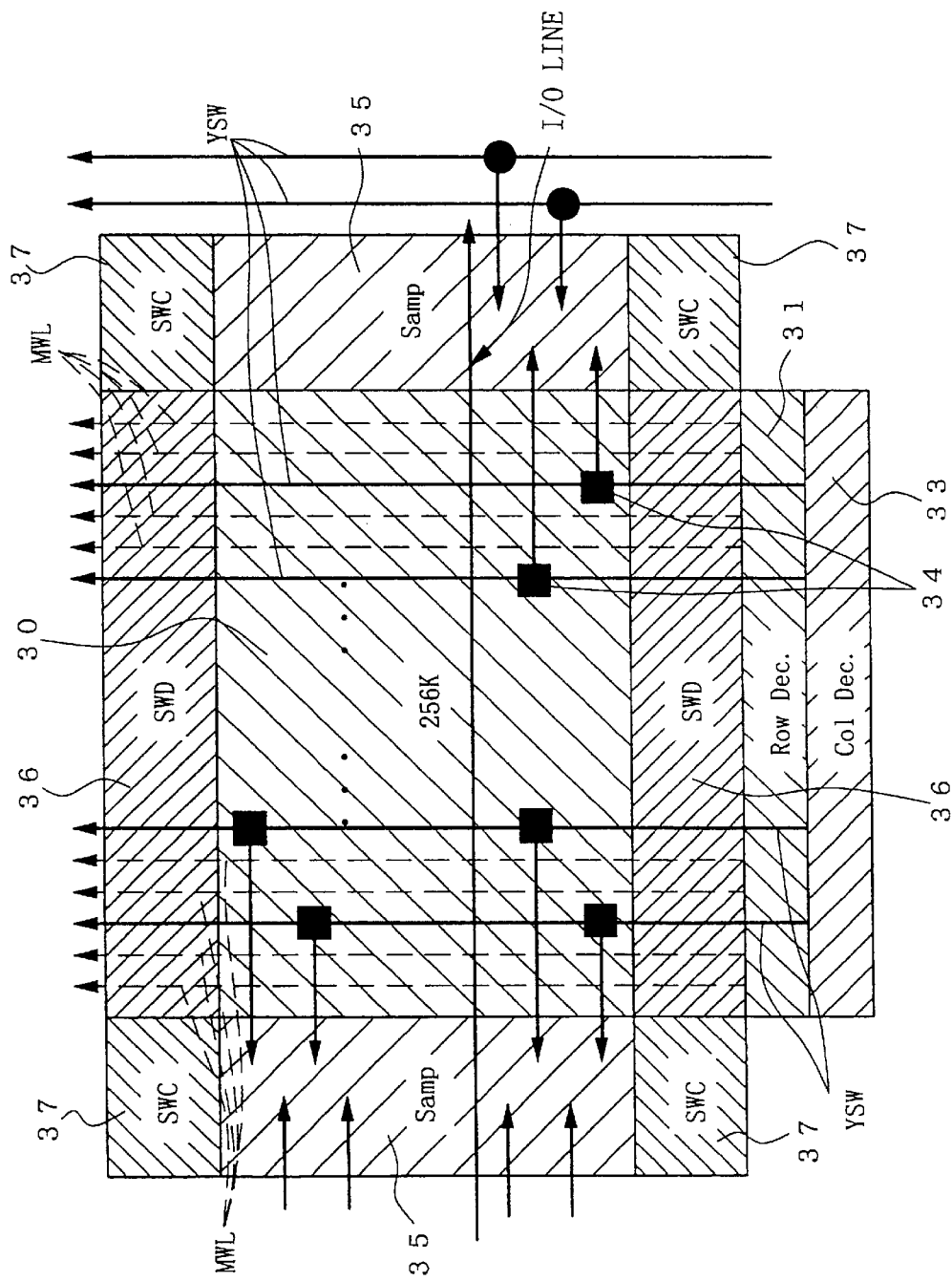
FIG. 2 is an enlarged view of area A1 in FIG. 1.

FIG. 2 is an enlarged view of area A1 (see FIG. 1) which is a division (or section) of the memory cell array block 21-1 and which corresponds to a bank in the crosswise (i.e., left to right) direction of the figure. As described above, each memory cell array block has a capacity of 32 Mbit, and includes (16×8=) 128 divisions, as shown in FIG. 1. Therefore, memory cell array 30 shown in FIG. 2 has a capacity of (32 Mbit/128=) 256 kbit.

Reference numeral 31 in FIG. 2 indicates a row decoder (see "Row Dec." in the figure) having the same structure as that explained in the conventional arrangement, and 16 row decoders 31 (of 16 banks) form the row decoder 3-1 shown in FIG. 1. From the row decoder 31, a plurality of main word lines MWL (indicated by broken arrows) parallel to each other are output upwards. As shown in FIG. 2, these main word lines MWL are arranged to pass through the memory cell array 30.

Most recent DRAMs use a word-line structure called "hierarchically-divided word driver method" for reducing the delay of the word lines. The present embodiment also employs this method. In this method, word lines are divided into sets of sub word lines, and a pair of a row decoder and word driver are commonly used by the divided sub word lines. These sub word lines arranged in the row direction are controlled in common by a relevant main word line MWL. In the present embodiment, 8 sub word lines are controlled by a main word line. In FIG. 2, the sub word lines are not shown so as to prevent complicating the figure.

Usually, the main word line MWL is provided in the first metallic wiring layer (i.e., the first metal such as aluminum), while the sub word line is provided in a wiring layer using a wiring material having a relatively high resistance such as a polysilicon.

The wiring pitch of the sub word line is narrow, such as less than 1 micron, so as to cope with the size of the memory cell: thus, it is almost impossible to provide an aluminum wiring line in that narrow pitch. On the other hand, the wiring pitch of the main word lines MWL is eight times as much as the wiring pitch of the sub word lines, that is, the main word lines have a looser wiring pitch in comparison with the sub word lines. The hierarchical structure of the word lines generates spaces between the main word lines MWL, and the spaces realize the word-line wiring using the same wiring material as that used for the main word lines MWL (i.e., the first metal).

Therefore, the present embodiment uses the spaces between the main word lines MWL so as to arrange column selecting signal YSW lines (generated by the column decoder 33 (see "Col Dec." in FIG. 2)) parallel to the main word lines MWL. The column decoder 33 in FIG. 2 relates to bank selecting logic and column address pre-decoding logic operations performed in the circuit blocks 24-1 and 24-2. The column selecting signals YSW are also supplied to sense amplifier areas 35 (see "Samp" in FIG. 2), each of which includes a sense amplifier; thus, wiring lines perpendicular to the main word lines MWL are formed using the second metallic wiring layer (i.e., the second metal) so as to let the column selecting signals YSW pass through the sense amplifier areas 35.

In order to connect the wiring lines using the first metal with the relevant wiring lines using the second metal, contacts (contact points) 34 are provided on the memory cell 30. As explained above, in the present embodiment, the column selecting signal vertically passing through the first metallic wiring layer then horizontally passes through the second metallic wiring layer via contact (i.e., direction-switching point) 34 towards the sense amplifier area 35. In the present embodiment, as shown in FIG. 2, a column selecting signal YSW is provided for two main word lines MWL.

In addition, a column selecting circuit (not shown) is also provided in the sense amplifier area 35 in FIG. 2. As explained later, actually, the column selecting signals YSW are connected to the column selecting circuit so as to control the connection state between the I/O line (running parallel in the figure) and the sense amplifier.

Reference numerals 36 in FIG. 2 indicate sub word drivers (see "SWD" in the figure) for driving the sub word lines, and reference numerals 37 indicate sub word driver control circuits (see "SWC" in the figure) for controlling the sub word driver 36. These control circuits have the same structure as that used in a DRAM employing the hierarchically-divided word driver method, and the structure does not directly relate to the distinctive features of the present invention. Therefore, detailed explanations thereof are omitted here.

Figure 3A:
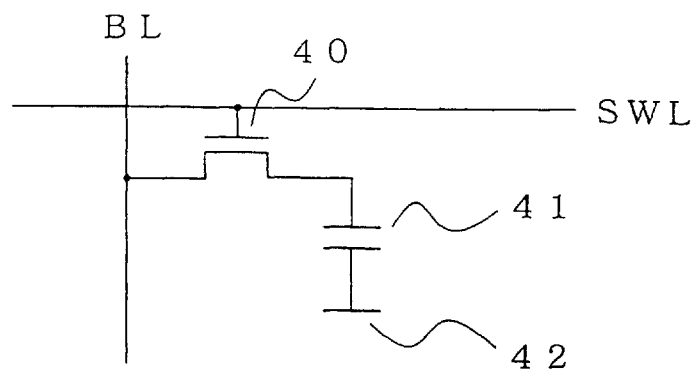
FIGS. 3A and 3B are diagrams showing an area in the vicinity of the memory cell in the embodiment.
Figure 3B:
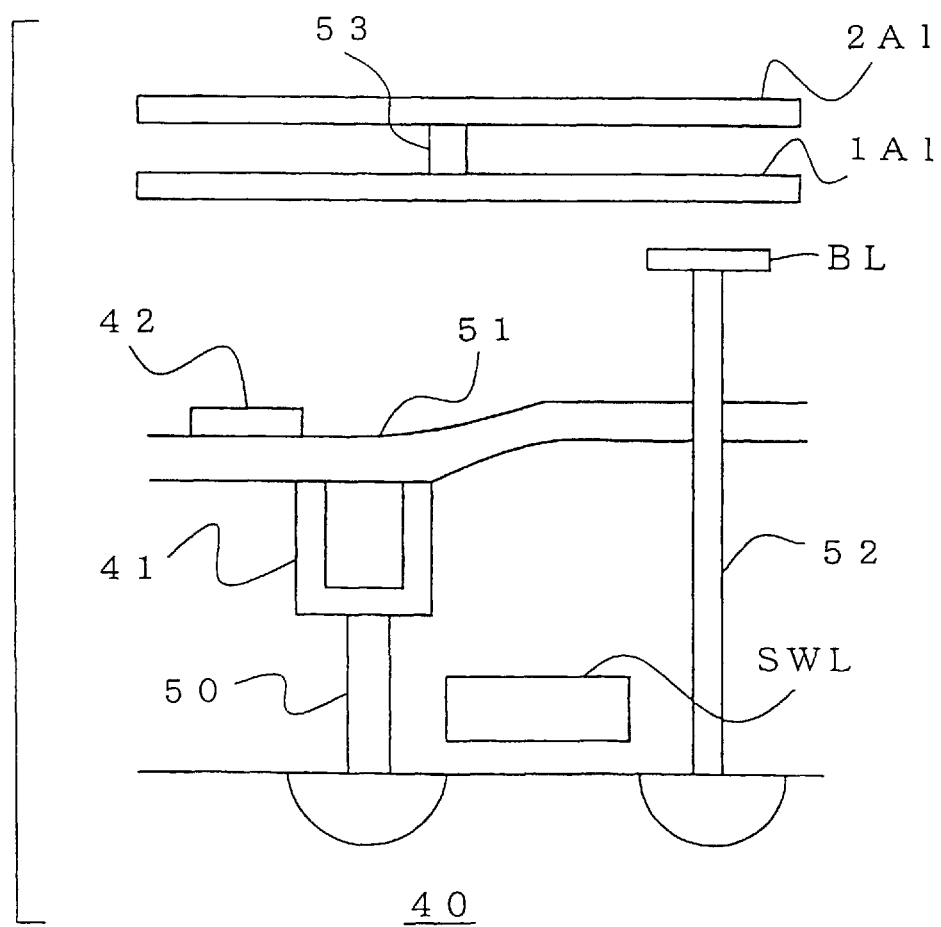

FIGS. 3A and 3B show the general structure of an area in the vicinity of the memory cell. In the area, the above-explained contact 34 (see FIG. 2) is formed on the memory cell.

FIG. 3A shows the logical connection relationship established in the vicinity of the memory cell. In the area, the bit line BL connected to the sense amplifier (not shown) vertically runs, and sub word line SWL connected to the gate of transistor 40 runs perpendicularly to the bit line BL. Reference numeral 41 indicates a cell capacitor for storing electric charge of the cell, one end of the capacitor being connected to transistor 40. In addition, cell counter-electrode 42 is an electrode connected to the other end of cell capacitor 41. The sub word line SWL is made of, for example, polysilicon, and bit line BL is made of, for example, titanium oxide (TiN), and cell capacitor 41 is made of, for example, stacking polymer.

FIG. 3B is a cross-sectional view of an area in the vicinity of the memory cell. The sub word line SWL is connected to the gate electrode of the cell transistor 40; thus, the line SWL is formed in the lowest layer where the transistor is formed. The cell capacitor 41 is formed above the cell transistor 40 via lower electrode 50, and is connected to the cell counter-electrode 42 via upper electrode 51. A wiring layer through which the bit line BL passes is formed on the upper electrode 51, and the bit line BL is connected to cell transistor 40 via contact 52. In addition, the first aluminum portion (see "1A1" in FIG. 3B) is provided on the wiring layer in which the bit line BL is provided, and the second aluminum portion (see "2A1") is further provided above the first aluminum portion. As described above, the word line WL and the pre-decoded column selecting signal are transmitted through the first aluminum portion. The column selecting signal passing through the first aluminum portion is also transmitted via through hole 53 in the second aluminum portion, so as to arrange the column selecting signal line (towards the column selecting circuit not shown) perpendicularly to the column selecting signal line on the first aluminum portion.

As for the area shown in FIG. 3B, the distinctive feature of the present invention in comparison with the conventional example is to provide the through hole 53 via which the first and second aluminum portions are connected. Even in such a structure, the relevant area is made flat using the CMP (chemical machine polishing) or the like before the wiring layers are formed on the memory cell. Therefore, the relevant area is not so rough, and the wiring is not limited by the foundation and thus the manufacturing is easy. Also in the conventional example, the memory cell has a plurality of contacts; however, the metallic wiring lines are not connected via through holes, and there is no conventional example which employs the wiring arrangement using contacts (such as through holes) on a complicated memory cell array as shown in the present embodiment. The reason for this is that in the conventional example, main word lines MWL and column selecting signal lines arranged in the memory cell do not contact each other, and thus it is unnecessary to connect the first and second aluminum portions on the memory cell.

FIG. 4 is a diagram showing the wiring of the column selecting signals YSW in detail. In the figure, bank Bank1 and its side banks Bank0 and Bank2 are shown. In the present embodiment, it is assumed that the column address in the address signal consists of 7 bits (from Y6 to Y0). Among these bits, column address bit Y0 is at the lower bit side, while the column address bit Y6 is at the higher bit side. Here, the number of bits forming the column address is not limited.

The black circles in FIG. 4 indicate column selecting circuits, and each circuit is connected to a sense amplifier (not shown). These column selecting circuits have the same structure which are explained later in detail. In FIG. 4, two or three circles indicate a group of the column selecting circuits. Actually, each group consists of 64 column selecting circuits. The reason for the "64" circuits is that ($2^7=$) 128 column selecting circuits corresponding to the number of bits of the column address are divided into two groups. These 64 column selecting circuits cannot be shown; thus, only two or three circles (i.e., circuits) are shown in the figure.

The column selecting circuits are used in common between the adjacent banks, except for the column selecting circuits at the left and right sides of each memory cell array block. More specifically, in FIG. 4, the column selecting circuit group 60-0 is dedicatedly used in bank Bank0, the column selecting circuit group 60-01 is used in common by banks Bank0 and Bank1, the column selecting circuit group 60-12 is used in common by banks Bank1 and Bank2, and the column selecting circuit group 60-23 is used in common by banks Bank2 and Bank3. The column selecting circuit groups other than those shown in the figure have the same structure, and the column selecting circuit group arranged at the right end of the memory cell array block is dedicatedly used by bank Bank15, as in the case of the column selecting circuit group 60-0. The banks Bank 16 to Bank31 have the similar structure, and the relevant sense amplifiers corresponding to the column selecting circuit groups also have the similar arrangement.

In FIG. 4, reference numerals 61-0 and 61-1 indicate global I/O lines. Generally, the I/O lines includes global I/O lines and local I/O lines. Four pairs (the pair of non-inversion signal and inversion signal) of global I/O lines are output from each memory cell array block in the horizontal direction. That is, reference symbol "I/O" in FIG. 1 shows a global I/O line. In FIG. 4, only 2 pairs among the 4 pairs are shown. The structure of the circuits connected to the 2 pairs of I/O lines have the same basic structures; thus, only circuits relating to global I/O lines 61-0 will be explained below. That is, reference numerals 62-0, 62-01, 62-12, and 62-23 indicate local I/O lines for connecting each memory cell and global I/O lines via the column selecting circuits and the like. For example, the data output from the memory cell is read out from the column selecting circuit group 60-0 via a sense amplifier (not shown) to local I/O lines 62-0, and is then transferred to global I/O lines 61-0, and finally, input into the data amplifier as explained in the conventional example.

Figure 13:
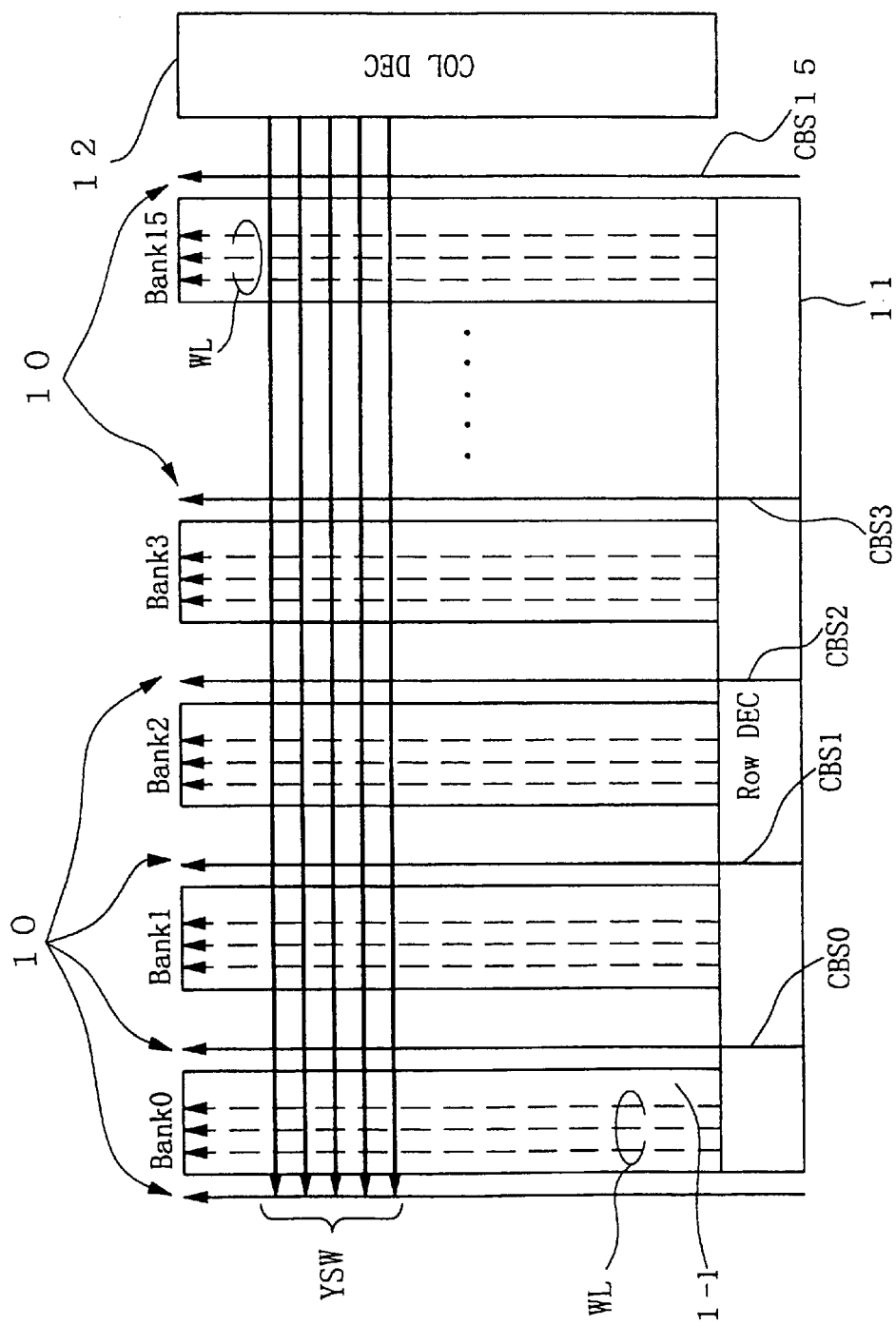
FIG. 13 is an enlarged view showing an area in the vicinity of memory cell array block 1-1 in FIG. 12.

The operation of selecting each column selecting circuit is performed as follows: Here, it is assumed that bank Bank1 is a target bank, and only the bank Bank1 is activated. In this case, a column selecting circuit included in the column selecting circuit group 60-01 or 60-12 may be selected. The column selecting circuit group 60-01 may be selected when the column address bit Y0=1, and the column selecting circuit group 60-12 may be selected when the column address bit Y0=0. Here, bits Y6 to Y0 shown in FIG. 4 have the bank selecting logic. For example, in FIG. 4, description "Y0=1" for bank Bank1 not only indicates that the column address bit Y0 is "1B", but indicates that bank Bank1 is being selected and the column address bit Y0 is "1B". Here, reference symbol "B" indicates the binary description. Therefore, in the present embodiment, it is unnecessary to let the bank selecting signals pass through the memory cell array in addition to the column selecting signals as in the conventional case (see FIG. 13), so that the sense amplifier area can be reduced. In an actual design, an approximately 8% area reduction was confirmed. The specific circuit arrangement for realizing the above feature will be explained later.

At either side of each column selecting circuit group, lines of 16 pre-decoded signals, which are obtained by bank-selecting and column address (Y6 to Y0) pre-decoding operations, vertically run parallel to word lines not shown. That is, at the left side of the column selecting circuit group, 8 pre-decoded signal lines (see "Y123" in FIG. 4) are provided for the signals obtained by pre-decoding the column address bits Y3 to Y1, while at the right side, 8 pre-decoded signal lines (see "Y456" in FIG. 4) are provided for the signals obtained by pre-decoding the column address bits Y6 to Y4. Among the 16 (8+8) pre-decoded signals, a logical product (AND) of one of the former 8 lines and one of the latter 8 lines is calculated so that one of 64 (8×8) column selecting circuits can be selected. In addition, pre-decoded signals related to "Y0=1" and "Y0=0" are assigned to each bank; thus, each of 128 column selecting circuits corresponding to each bank can be selected in the one-to-one corresponding relationship. Here, lines for all pre-decoded signals cannot be shown, and only two or three lines among 8 lines are shown in FIG. 4.

Figure 9:
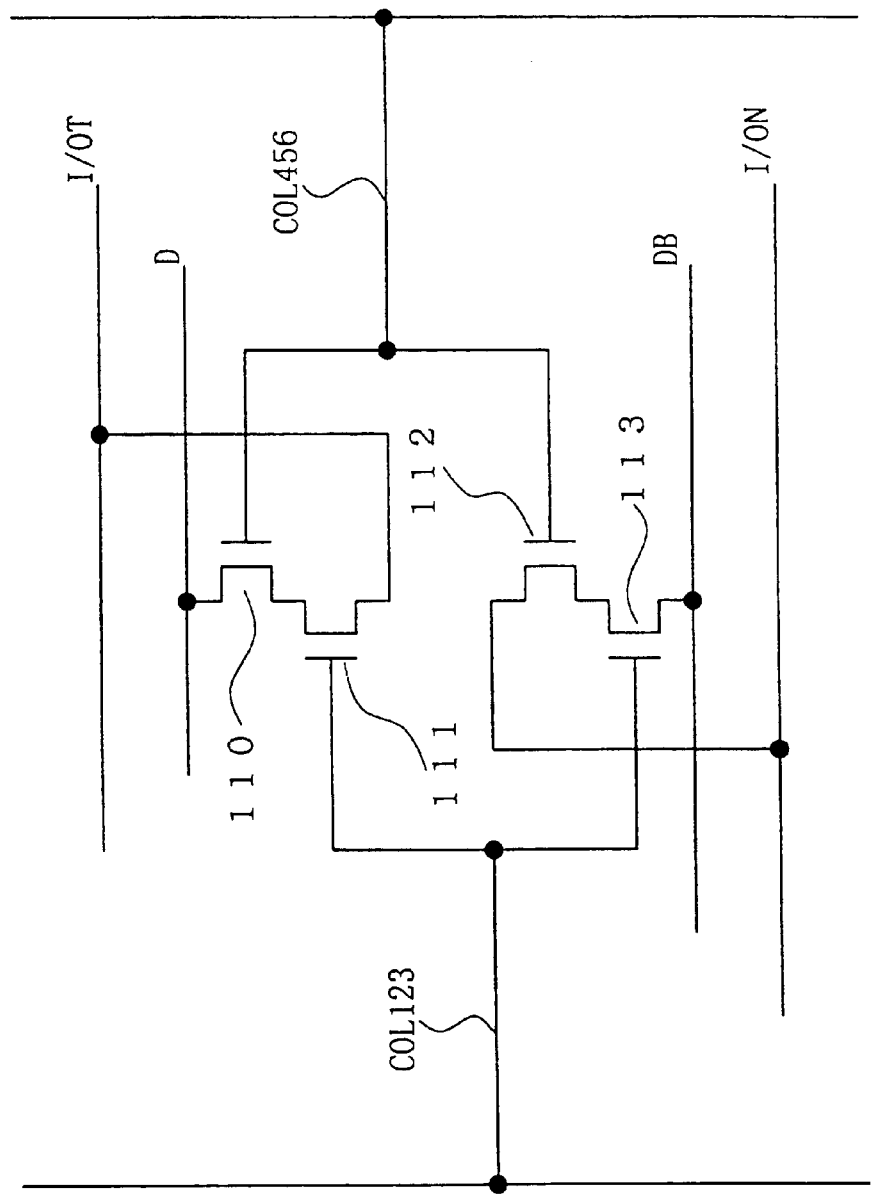
FIG. 9 is a circuit diagram showing the detailed structure of the column selecting circuit in the embodiment.

As explained above, the pre-decoding of the column address is separately performed for bits Y3 to Y1 and bits Y6 to Y4, and the pre-decoded signals are also divided (into 8 and 8 lines) and arranged at either side of the column selecting circuit. Such an arrangement has the following advantage. Logically, another arrangement is possible, for example, all bits Y6 to Y1 of the column address can be decoded. In this case, the number of stages of the N-channel transistors as shown in FIG. 9 (explained later) can be reduced from 2 to 1. However, in this case, the number of lines of the pre-decoded signals output to the column selecting circuits is ($2^6=$) 64, and actually, it is very difficult to provide these lines because of the limitation of the wiring pitch of the main word lines.

In addition, the pre-decoded signal lines may be divided into three groups. For example, bits Y2 to Y1, bits Y4 to Y3, and bits Y6 to Y5 may be respectively pre-decoded, and accordingly, the number of pre-decoded signal lines can be reduced from 16 to (4+4+4=) 12. However, in this case, the number of stages of N-type transistors as shown in FIG. 9 (explained later) is not two but three; thus, the area of the column selecting circuit should be larger in comparison with the two-stage transistor arrangement. In addition, if the number of stages of the transistors provided between the digit lines D and DB, and signal lines I/OT and I/ON increases, the "on" resistance of the transistors increase, so that data output from the sense amplifier is not easily transmitted from the digit lines to the I/O lines.

In another example, the pre-decoding operation itself may be performed in 2-divided form as shown in FIG. 4, and the lines for the 16 pre-decoded signals are arranged not at either side of the column selecting circuit, but at one side thereof. However, the 16 wiring lines are formed in the same metallic layer; thus, these signal lines cannot overlap. Therefore, in the above arrangement, the number of wiring lines at one side is two times as much as that shown in FIG. 4, and it is not preferable in consideration of the wiring pitch.

Consequently, in the arrangement of the pre-decoded signal lines as shown in FIG. 4, the pre-decoded signals generated using the column address bits Y3 to Y1 and the pre-decoded signals generated using the column address bits Y6 to Y4 can be input into the column selecting circuits from both sides of the circuits; thus, the limitation of the wiring pitch can be greatly eased. Therefore, the arrangement as shown in FIG. 4 (or FIG. 9) is preferable.

Below, the method of selecting each column selecting circuit will be further explained.

As for column selecting circuit 63, two pre-decoded signals 64-1 and 64-2 are input into the circuit 63. When all the column address bits Y3 to Y1 are "0B", pre-decoded signal 64-1 is effective, while all the column address bits Y6 to Y4 are "0B", pre-decoded signal 64-2 is effective. In this case, bank Bank1 is being selected, and the column address bit Y0 is "1B". Under these conditions, the column selecting circuit 63 is selected when the column address Y6 to Y0 is "0000001B" ($01). Here, the reference symbol "$" indicates that the hexadecimal description is employed.

Similarly, two pre-decoded signals 64-1 and 64-3 are input into the column selecting circuit 65. If it is assumed that pre-decoded signal 64-3 becomes effective when the column address bits Y6 to Y4 are "100B", then the column selecting circuit 65 is selected when the column address Y6 to Y0 is "1000001B" ($41). The other column selecting circuits are similarly selected according to the combination of the pre-decoded signals related to bits Y1 to Y3 (i.e., Y123) and the pre-decoded signals related to bits Y4 to Y6 (i.e., Y456).

As described above, for example, the column selecting circuit group 60-01 is used in common by banks Bank0 and Bank1. Therefore, also when the bank Bank0 is activated and the column address bit Y0 is 1, a column selecting circuit belonging to the column selecting circuit group 60-01 is selected.

Below, the circuit arrangement for generating the pre-decoded signals input into the column selecting circuit group as shown in FIG. 4 will be explained with reference to FIGS. 5 to 8.

Figure 5:
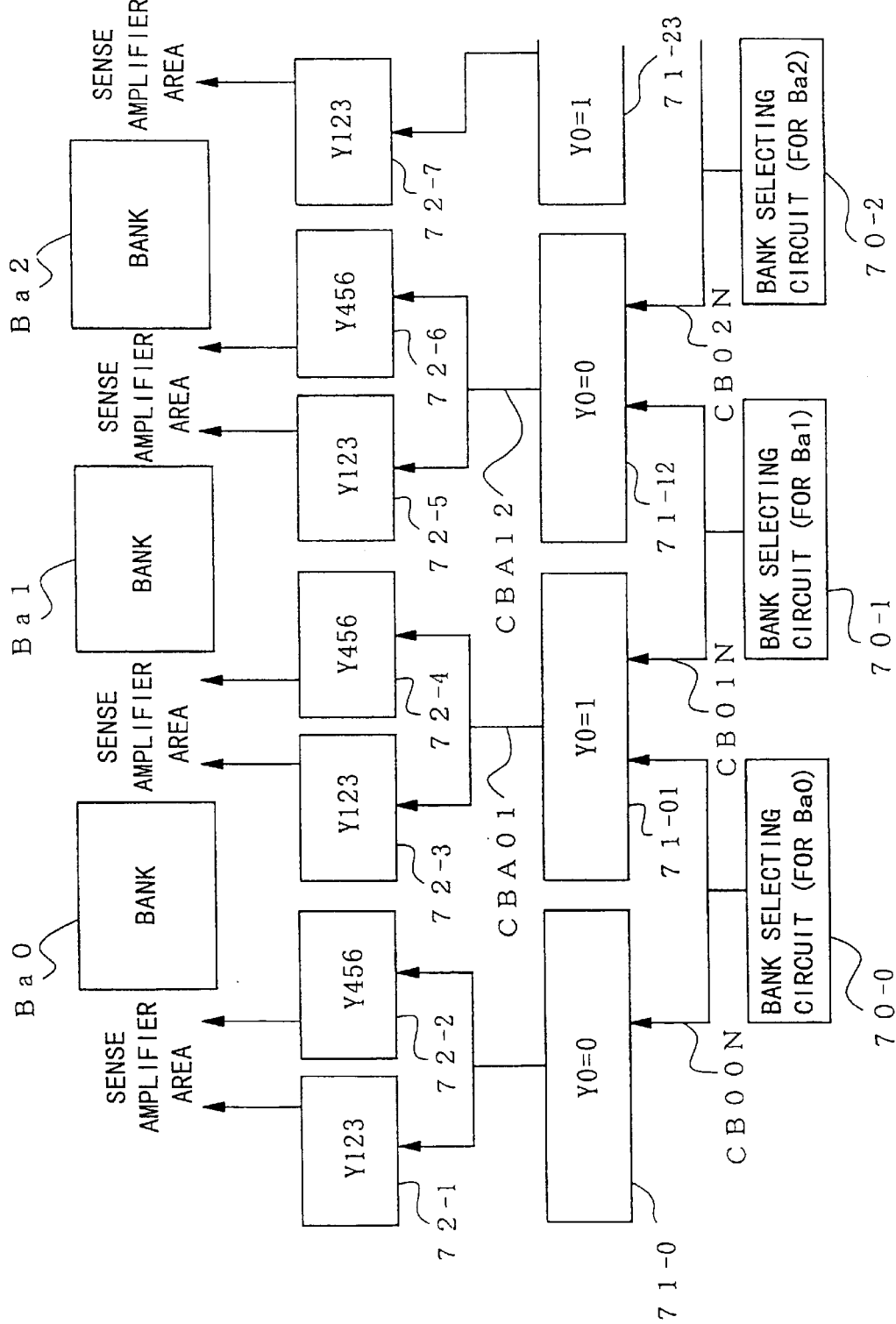
FIG. 5 is a block diagram showing the circuit arrangement for generating the pre-decoded signals input into the column selecting circuit block in the embodiment.

FIG. 5 is a diagram showing the general structure of this circuit, which is provided in the column decoder 33 shown in FIG. 2. In accordance with FIG. 4, FIG. 5 also shows circuit blocks related to bank Bank1 (abbreviated as "Ba1" in the figure) and its adjacent banks Ba0 and Ba2. In FIG. 5, some signals input into each circuit block are omitted. These omitted signals are suitably explained when each circuit block is explained in detail.

In FIG. 5, reference numerals 70-0 to 70-2 indicate bank selecting circuits for selecting banks Ba0 to Ba2. When a target bank is selected, the corresponding bank selecting circuit outputs a signal of level "H" (high). The detailed structure of bank selecting circuit 70-0 (as a representative) will be explained with reference to FIG. 6.

Figure 6:
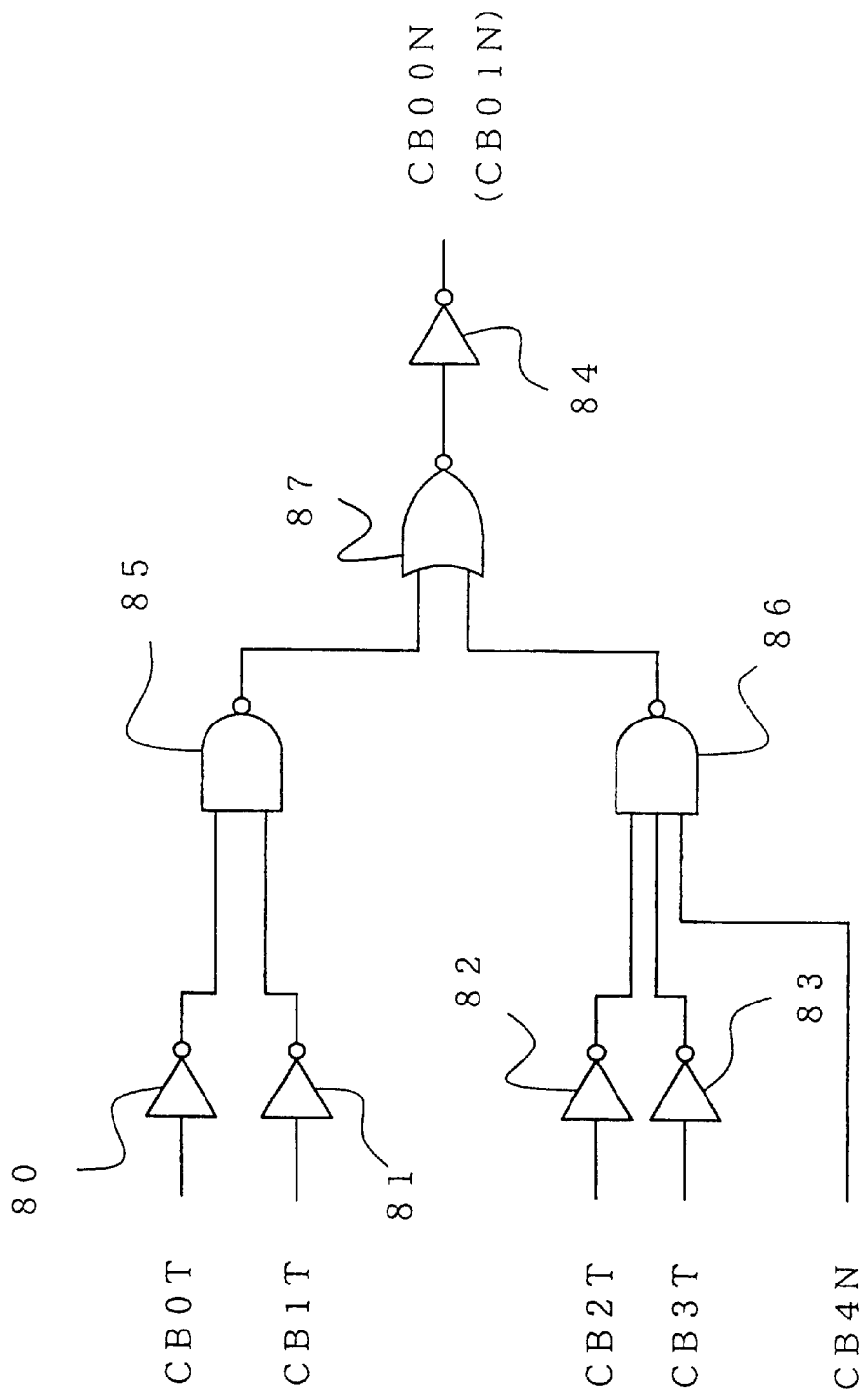
FIG. 6 is a circuit diagram showing the detailed structure of bank selecting circuit 70-0 in FIG. 5.

In FIG. 6, reference symbols CB0T to CB3T, and CB4N indicate a bank selecting signal for selecting one of 32 banks, and it consists of 5 bits corresponding to upper 5 bits of an address signal supplied from an external device of the semiconductor memory device. The bank selecting signal bit CB0T is the lower bit side, while the bank selecting signal bit CB4N is the upper bit side. Additionally, the last character T of the signal name (for example, "T" of CB0T) indicates that the signal (bit) is based on the positive logic, while the last character N of the signal name indicates that the signal is based on the negative logic. These principles are also applied to signals explained later. In addition, reference numerals 80 to 84 indicate inverters, reference numeral 85 indicates a 2-input NAND gate, reference numeral 86 indicates a 3-input NAND gate, and reference numeral 87 indicates a 2-input NOR gate.

According to the shown circuit arrangement, only when both the bank selecting signal bits CB0T and CB1T have the "L" (low) level (i.e., both the 0th and 1st bits of the bank selecting signal are "0B"), the output of the NAND gate 85 has the "L" level. Similarly, both the bank selecting signal bits CB2T and CB3T have "L" level and bank selecting signal bit CB4N has "H" level (i.e., the 4th to 2nd bits of the bank selecting signal are "000B"), the output of the NAND gate 86 has the "L" level. The bank selecting signal bits CB0T to CB3T, and CB4N satisfy the above conditions only when bank Ba0 is selected, and only in this case, the output of NOR gate 87 has the "H" level, so that the bank selecting signal CB00N, the output of inverter 84, has the "L" level.

The bank selecting circuits corresponding to banks Ba1 to Ba31 may have circuit arrangements similar to that of bank Ba0. For example, the bank selecting signal CB01N (put in the bracket in FIG. 6) is effective only when bank Ba1 is selected, and is generated by using bank selecting signal bit CB4T (not shown) in place of the bank selecting signal bit CB4N shown in FIG. 6. CB4T is a conversion signal of CB4N.

According to the above operation, bank selecting circuits 70-0 to 70-2 respectively output bank selecting signals CB00N to CB02N, where each signal has "L"level only when the corresponding bank (Ba0, Ba1, or Ba2) is selected.

Figure 7:
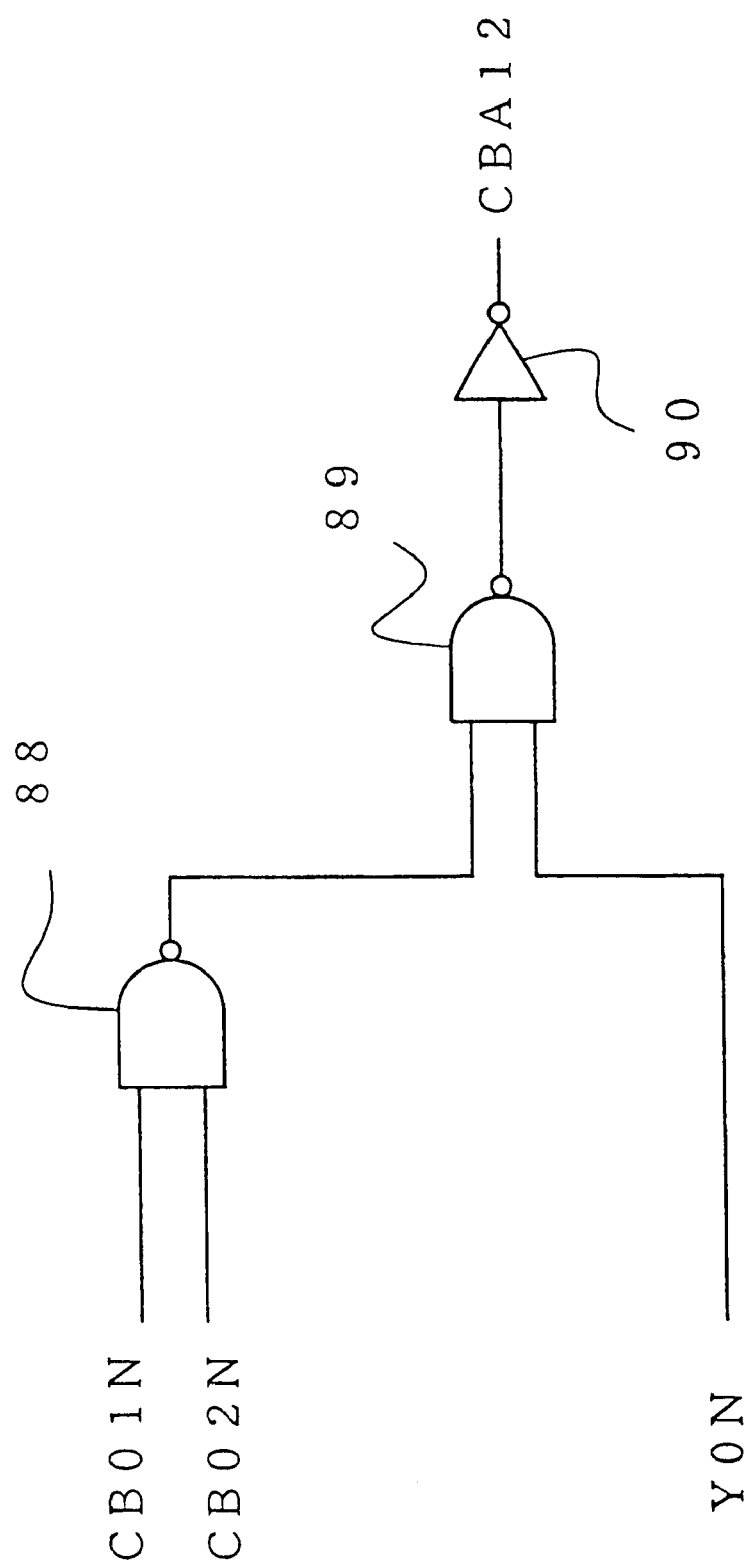
FIG. 7 is a circuit diagram showing the detailed structure of selecting circuit 71-12 in FIG. 5.

The selecting circuit 71-12 shown in FIG. 5 is provided for selecting the column selecting circuit group 60-12 shown in FIG. 4. FIG. 7 shows the detailed structure of selecting circuit 71-12. In FIG. 7, reference symbol Y0N indicates a signal obtained by inverting column address bit Y0, reference numerals 88 to 89 indicate 2-input NAND gates, and reference numeral 90 indicates an inverter. According to the circuit arrangement in FIG. 7, if at least one of bank selecting signals CB01 and CB02 has "L" level, then the output from NAND gate 88 has "H" level. In addition, only when signal Y0N has "H" level, the output from NAND gate 89 has "L" level, so that the output from inverter 90, that is, the selecting signal CBA12, has "H" level.

Therefore, when bank Ba1 or Ba2 is being selected, and the column address bit Y0 is "0B", selecting signal CBA12 has "H" level. The selecting circuits other than selecting circuit 71-12 may have a similar structure. For example, bank selecting signals CB00N and CB01N, and signal Y0T (not shown) which is an inversion signal of signal Y0N are input into the selecting circuit 71-01. In this arrangement, only when at least one of the bank selecting signals CB00N and CB01N has "L" level and signal Y0T has "H" level, selecting signal CBA01 having "H" level is output.

Figure 8:
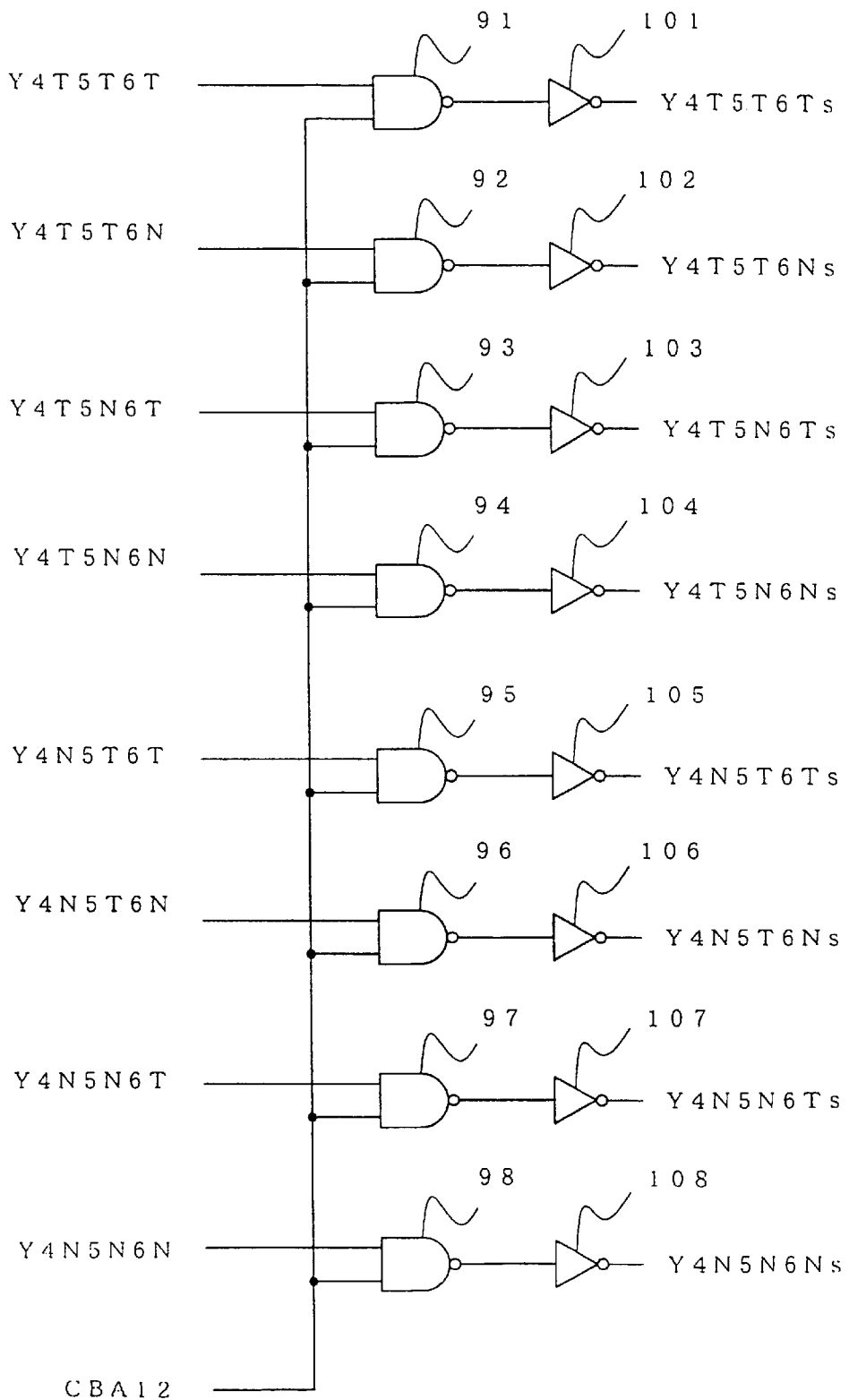
FIG. 8 is a circuit diagram showing the detailed structure of decoding circuit 72-6 in FIG. 5.

The decoding circuits 72-1 to 72-7 shown in FIG. 5 generate pre-decoded signals input into column selecting circuits 60-0, 60-01, 60-12, 60-23 (see FIG. 4), and the like. FIG. 8 shows the detailed structure of decoding circuit 72-6 (as a representative). In FIG. 8, reference numerals 91 to 98 indicate 2-input NAND gates, and reference numerals 101 to 108 indicate inverters. In addition, signal Y4N5N6N has "H" level only when all of the column address bits Y6 to Y4 are "0B". Here, it is assumed that three signals Y4N to Y6N (not shown) have "H" level when all of the column address bits Y4 to Y6 is "0B". In this case, the above signal Y4N5N6N can be obtained by operating the logical product between the signals Y4N to Y6N. On the other hand, signal Y4N5N6T has "H" level when column address bits Y6 to Y4 are "100B". Similarly, signal Y4T5T6T has "H" level when the column address bits Y6 to Y4 are "111B". If it is assumed that three signals Y4T to Y6T (not shown) have "H" level when all of the column address bits Y4 to Y6 is "1B", the above signal Y4T5T6T can be obtained by operating the logical product between the signals Y4T to Y6T.

The logical product operations between these 8 signals Y4N5N5N to Y4T5T6T, and selecting signal CBA12 (see FIG. 5) are performed using NAND gates 91 to 98, and the results are respectively input into inverters 101 to 108, so that 8 final decoded signals Y4N5N6Ns to Y4T5T6Ts are obtained. The above explanations relate to column address bits Y6 to Y4; however, similar operations are performed for column address bits Y3 to Y1. For example, in order to realize selecting circuit 72-5 shown in FIG. 5, selecting signal CBA12 (as in the case of realizing selecting circuit 72-6), and 8 signals (corresponding to signals Y4N5N6N to Y4T5T6T in FIG. 8) obtained by decoding 3 column address bits Y3 to Y1 are input into the circuit 72-5, and the logical products between the 8 decoded signals and selecting signal CBA12 are calculated and then the results are output. The selecting circuits 72-3 to 72-4 may use selecting signal CBA01 instead of selecting signal CBA12 used by selecting circuits 72-5 to 72-6.

Figure 14:
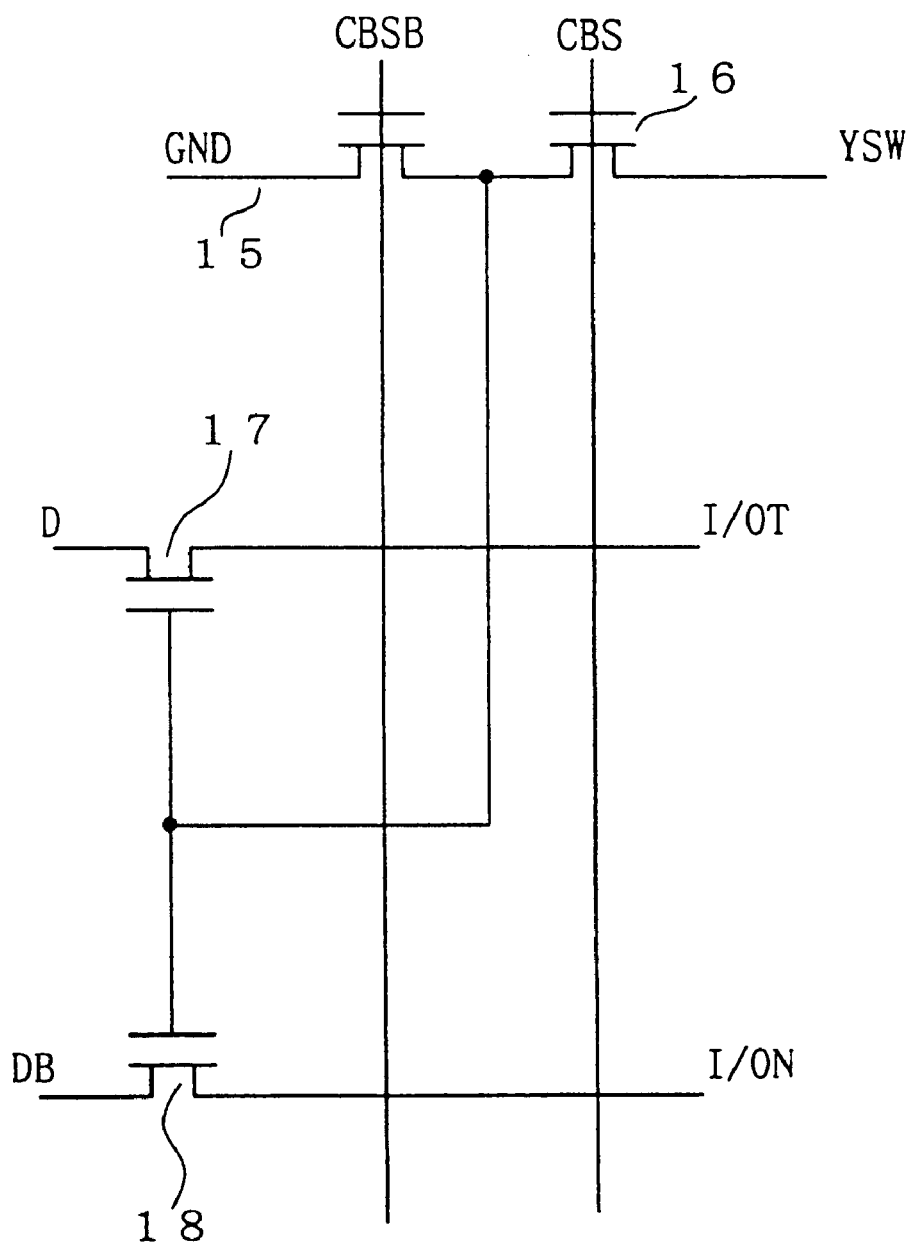
FIG. 14 is a circuit diagram showing the detailed structure of the column selecting circuit in the conventional example.

FIG. 9 shows the detailed structure of each column selecting circuit shown in FIG. 4. In FIG. 9, signals corresponding to those in FIG. 14 are given identical signal names. In FIG. 9, reference numerals 110 to 113 indicate N-channel transistors, and reference symbol COL123 indicates one of 8 pre-decoded signals indicated by "Y123" in FIG. 4, and reference symbol COL456 indicates one of 8 pre-decoded signals indicated by "Y456" in FIG. 4. In the column selecting circuit of the present embodiment, the pre-decoded signals related to the upper portion and lower portion of the column address are input from both sides of the column selecting circuit, where the input signal lines are parallel to the digit lines and I/O lines. The input signals are supplied to the gates of 2-stage transistors (TR110 to 111, or TR112 to 113) placed one on another.

When the column selecting circuit shown in FIG. 9 is selected, two pre-decoded signals COL123 and COL456 have "H" level; thus, all transistors 110 to 113 are on, and digit line D and signal line I/OT are connected with each other and digit line DB and signal line I/ON are connected to each other. On the other hand, when the column selecting circuit shown in FIG. 9 is not selected, at least one of pre-decoded signals COL123 and COL456 has "L" level; thus, one of the 2-stage transistors is off, so that the digit lines D and DB are not connected with signal lines I/OT and I/ON. As explained above, each column selecting circuit, provided in the area where the relevant memory cell array is arranged, performs the final decoding (i.e., main decoding) operation by using the bank selecting signal and the two pre-decoded signals obtained by pre-decoding column address bits Y6 to Y0.

According to the above explanations, the operation of the semiconductor memory device of the present embodiment is clearly understandable; however, the general operation related to the present invention will be further explained. Here, the operation performed when data is read from the semiconductor memory device is explained; however, the operation performed when data is stored in the semiconductor memory device is basically the same except for the data transfer direction.

If it is assumed that the address signal is supplied from an external device outside of the semiconductor memory device, this address signal is transmitted to circuit blocks 24-1, 24-2, and row decoders 3-1 to 3-8 via a bonding pad and the input/output interface circuit in circuit block 6 in FIG. 1. The row decoders 3-1 to 3-8 decode the row address included in the address signal, and activate the word lines corresponding to the designated row address. More specifically, these row decoders activate main word line MWL (refer to FIG. 2) and, sub word driver control circuit 36 and sub word driver 37 in FIG. 2 activate 8 sub word lines SWL (refer to FIGS. 3A and 3B) connected to the main word line MWL. Accordingly, cell transistor 40 connected to the sub word line SWL corresponding to the designated row address becomes on, and the data stored in the relevant memory cell is output onto bit line BL.

In the circuit blocks 24-1 and 24-2 in FIG. 1, sense amplifier activating signal SAA (see FIG. 11) related to the bank designated by the bank address included in the input address signal is activated. If bank Ba1 is designated, the sense amplifiers provided at both sides are activated. That is, with reference to FIG. 2, sense amplifiers (not shown) in sense amplifier areas 35, 35 arranged at either side of memory cell array 30 are activated. Each activated sense amplifier senses the level of the signal on bit line BL connected to itself, and outputs the sensed result onto the digit lines D and DB (see FIG. 9).

According to the bank address and column address Y6 to Y0 included in the input address signal, the column decoders 33 (see FIG. 2) in the circuit blocks 24-1 and 24-2 make two of the 32 pre-decoded signals (related to the column address) effective. As it is assumed that bank Ba1 is selected here, the pre-decoded signals corresponding to the column selecting circuit groups such as 60-01 and 60-12 (see FIG. 4) are target signals. If it is assumed that the column address Y6 to Y0 are "1000001B" ($41), then pre-decoded signals 64-1 (Y123 side) and 64-3 (Y456 side) in FIG. 4 are made effective, so that the former is input into the column selecting circuits 63 and 65, while the latter is input into the column selecting circuits 65 and 66.

As a result, column selecting circuit 65, for which both the "Y123" and "Y456" side pre-decoded signals are effective, is selected. That is, in the column selecting circuit 65, both the pre-decoded signals COL123 and COL456 shown in FIG. 9 become effective, so that the above-explained digit lines D and DB of the sense amplifier are connected to the signal lines I/OT and I/ON. Then, the data stored in the memory cell connected to the column selecting circuit 65 is transferred via the local I/O lines 62-01 (see FIG. 4) to the global I/O lines 61-0, and is further transferred to, for example, circuit block 22-1 as shown in FIG. 1. In this circuit block 22-1, a data amplifier having a structure similar to that of data amplifier in FIG. 10 amplifies the signal on the global I/O lines. The above operation is simultaneously performed with respect to 32 I/O sections in each of the memory cell array blocks 21-1 to 21-4 (or memory cell array blocks 21-5 to 21-8), so that data of 128 I/O lines are output via circuit block 6 to the outside of the semiconductor memory device.

Figure 10:
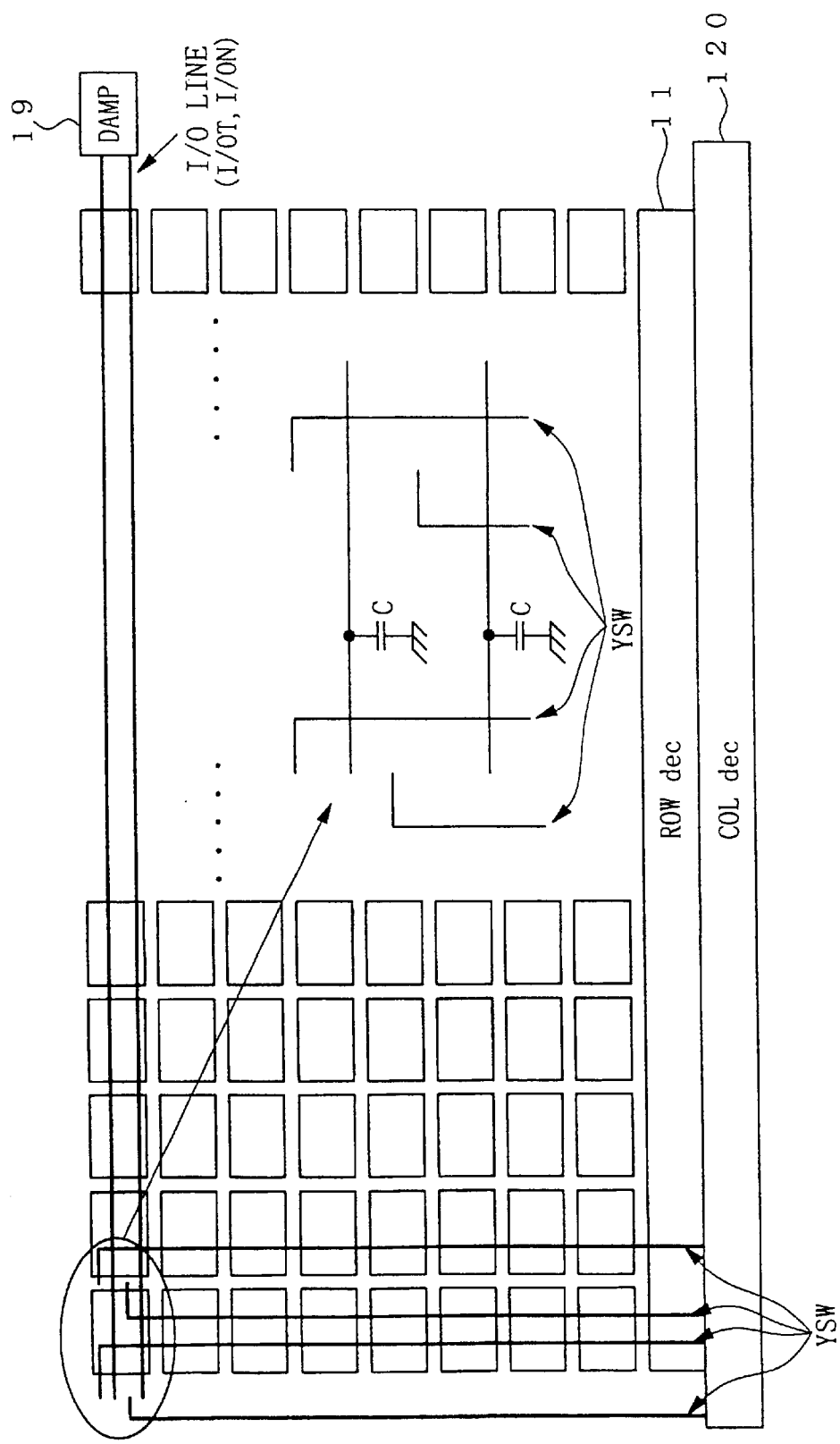
FIG. 10 is a diagram showing the relationship between the column selecting signal lines and I/O lines in the embodiment.
Figure 15:
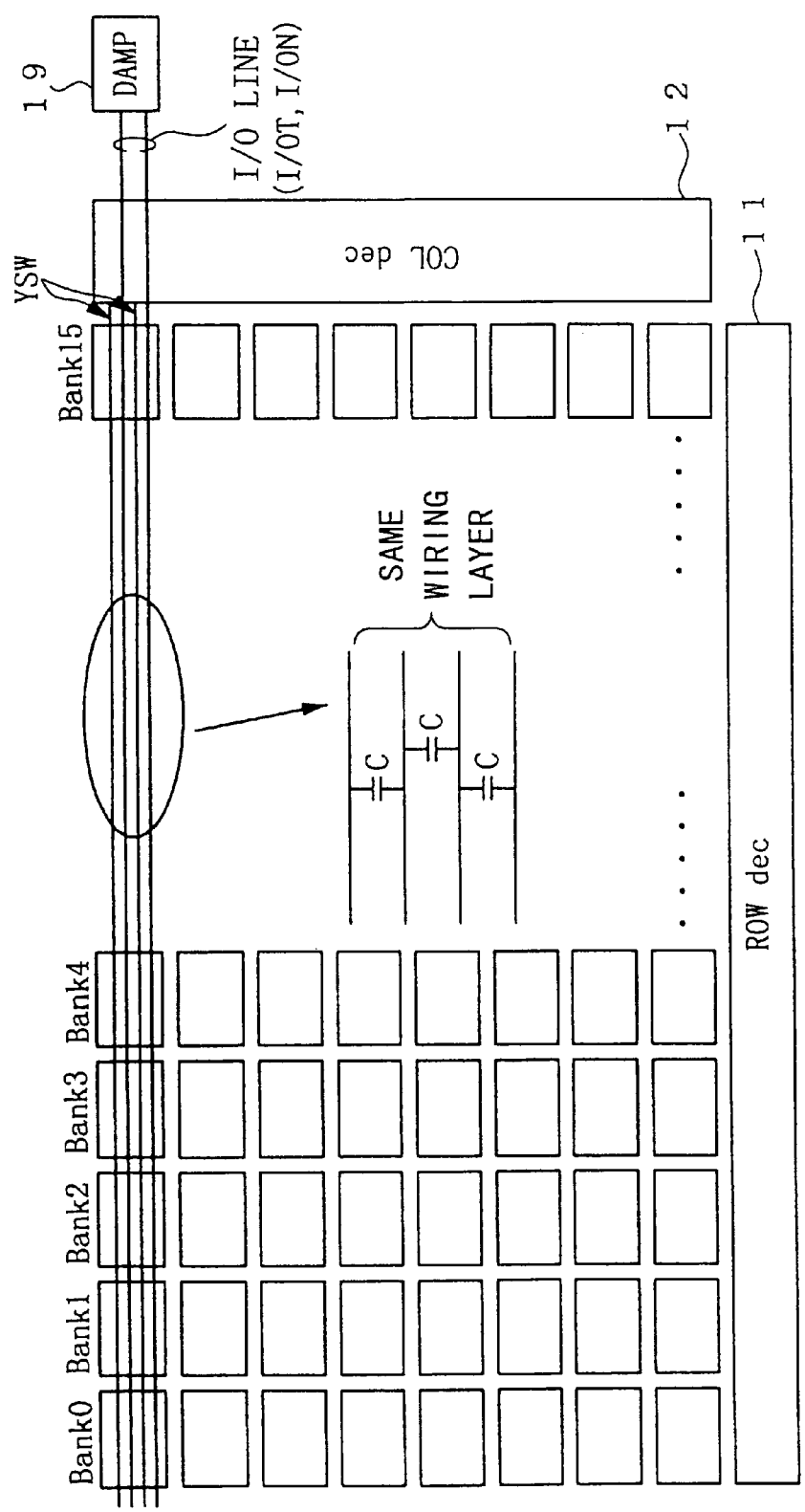
FIG. 15 is a diagram showing the relationship between the column selecting signal lines and I/O lines in the conventional example.

According to the present embodiment, the above-described conventional problem with respect to the cross talk between the column selecting signal YSW lines and the I/O lines (refer to FIG. 15) does not occur. FIG. 10 shows the relationship between the column selecting signal YSW lines and the I/O lines in the present embodiment. In FIG. 10, parts and signals identical to those in FIG. 15 are given identical reference numerals and signal names. As shown in FIG. 10, the present embodiment has the same I/O line arrangement as that in the conventional example, that is, global I/O lines are horizontally arranged from a column selecting circuit (not shown, but positioned at the left end of the figure) to the data amplifier 19.

On the other hand, the column selecting signal YSW lines are not arranged close to and parallel to the I/O lines (as in the conventional case), but are vertically arranged from column decoder 120 (see "COL dec" in FIG. 10). The column selecting signal YSW lines are parallel to the word lines not shown, but turn perpendicularly towards target column selecting circuits near the circuits. As explained above, in the present embodiment, almost all portion of the wiring lines of the column selecting signals YSW are arranged perpendicularly to the I/O lines; thus, the coupling between these signals is substantially not observed, and thus the signals on the I/O lines are not affected by noise caused by the crosstalk. In addition, in the present embodiment, the column decoder 120 is provided not close to data amplifier 19 but close to row decoder 11 (see "ROW dec" in FIG. 10), thereby simplifying the layout of the portion where signals are transmitted from the memory cell array block to data amplifier 19.

Figure 11:
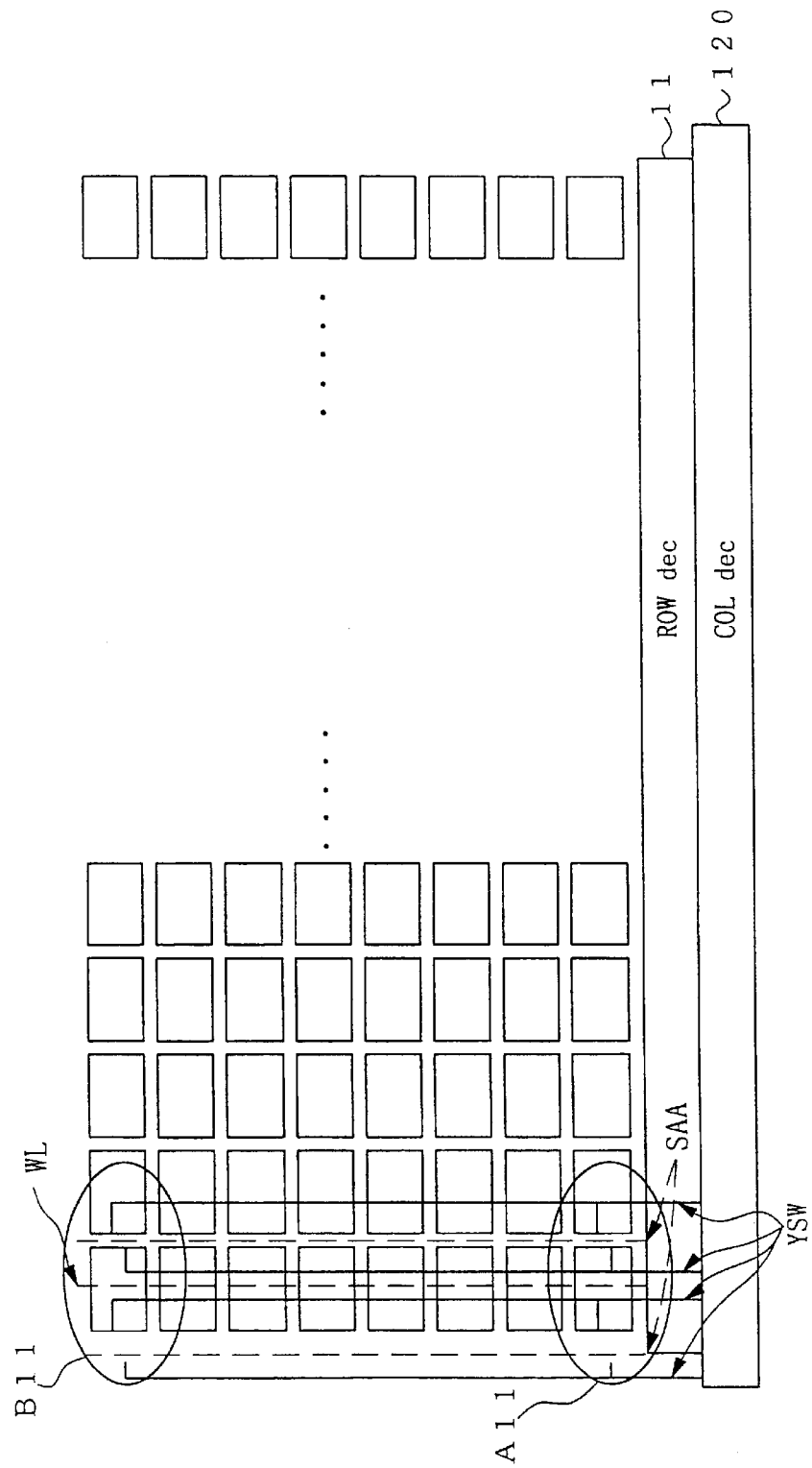
FIG. 11 is a diagram showing the relationship between the column selecting signal lines, word lines, and sensing operation signal lines in the embodiment.
Figure 16:
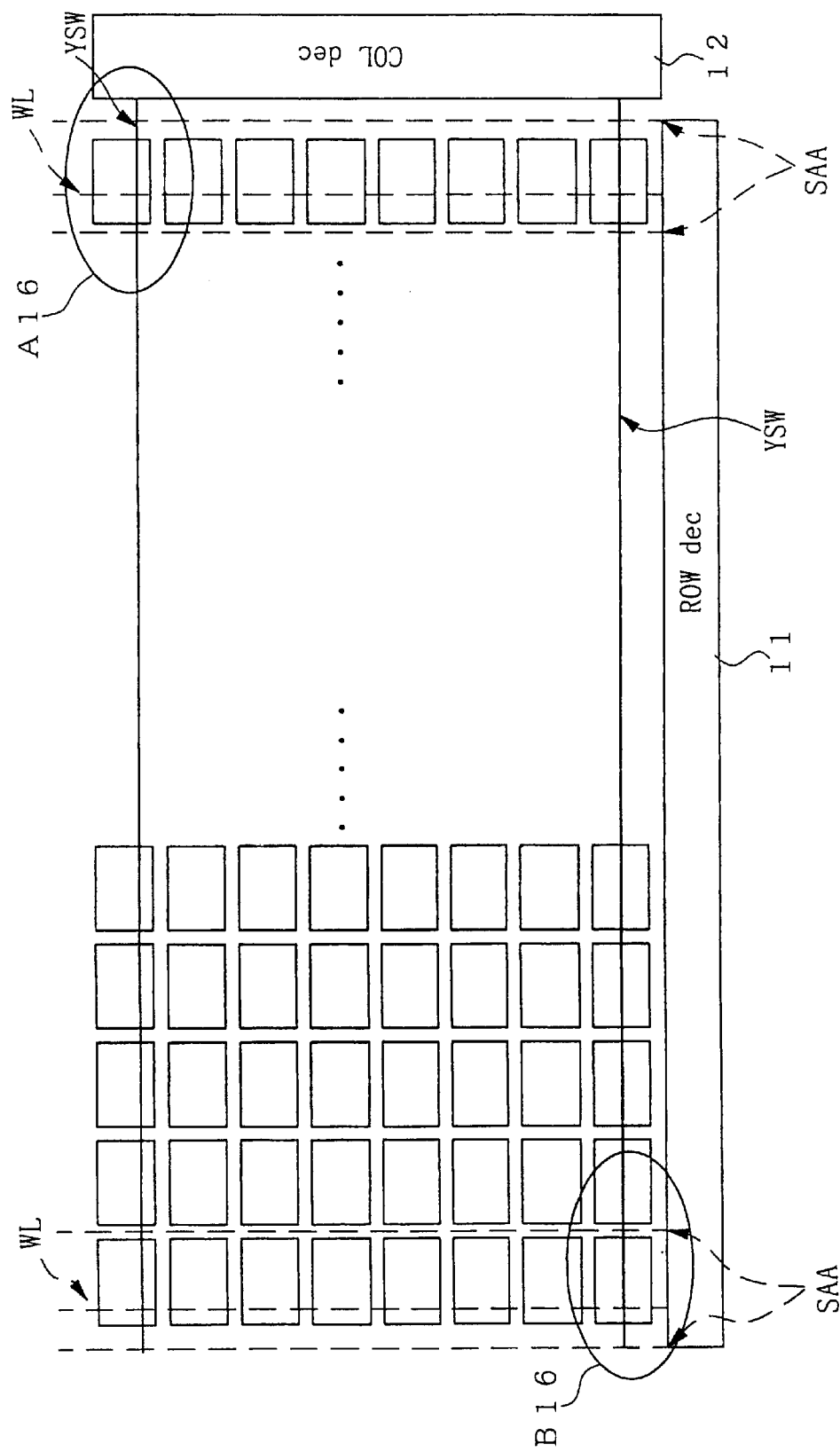
FIG. 16 is a diagram showing the relationship between the column selecting signal lines, word lines, and sensing operation signal lines in the conventional example.

Also according to the present embodiment, the above-described conventional problem relating to the temporal margin from the time when the sense amplifier activating signal is made effective to the time when the column selecting signal is made effective (refer to FIG. 16) does not occur. FIG. 11 shows the relationship between the column selecting signals, word lines, and signals relating to the sensing operation in the present embodiment. In FIG. 11, parts and signals identical to those in FIG. 16 are given identical reference numerals and signal names. As shown in FIG. 11, in the present embodiment, sense amplifier activating signals SAA (i.e., sensing operation signals), column selecting signals YSW, and word line WL run in the same direction, that is, parallel to each other. Therefore, for example, area A11 is a near end for the word line, sensing operation signals, and column selecting signals YSW, while area B11 is a far end for the word line, sensing operation signals, and column selecting signals YSW. That is, in the present embodiment, the delay distribution of word line, sensing operation signals, and column selecting signals is uniform over the memory cell array block. Therefore, the temporal margin from the time when the sense amplifier activating signal SAA becomes effective to the time when the column selecting signal YSW becomes effective can be approximately fixed based on either of area A11 or area B11.

What is claimed is:

1. A semiconductor memory device having a plurality of memory blocks, each block including a plurality of memory banks, wherein a target memory cell in the memory blocks is accessed according to an input bank address, row address, and column address, the semiconductor memory device comprising:
   a row decoding section for decoding the row address so as to generate a row selecting signal; and
   a column decoding section, adjacent to the row decoding section, for decoding the column address so as to generate a column selecting signal, and
   wherein word lines driven by the row selecting signal and column selecting signal lines for outputting the column selecting signal are arranged parallel to each other in plain view, so as to supply these signals to the memory block of the target memory cell and to access the memory cell.

2. A semiconductor memory device as claimed in claim 1, wherein the column selecting signal lines are provided between the adjacent word lines.

3. A semiconductor memory device as claimed in claim 1, wherein the word lines and the column selecting signal lines are supplied to the memory block from the same direction.

4. A semiconductor memory device as claimed in claim 1, wherein the word lines and the column selecting signal lines are formed in the same wiring layer.

5. A semiconductor memory device as claimed in claim 1, wherein each word line has a hierarchical structure including sub word lines connected to the memory cells and a main word line which controls these sub word lines.

6. A semiconductor memory device having a plurality of memory blocks, each block including a plurality of memory banks, wherein a target memory cell in the memory blocks is accessed according to an input bank address, row address, and column address, the semiconductor memory device comprising:
   a row decoding section for decoding the row address so as to generate a row selecting signal;
   a column pre-decoding section for pre-decoding the column address so as to generate a column pre-decoded signal; and
   a column decoding section, provided in an area of the memory block where a sense amplifier for sensing the memory cell is provided, for performing the main decoding operation of the column address based on the column pre-decoded signal, and selecting the column on the memory block designated by the column address,
   wherein the column decoding section generates a column selecting signal by performing the main decoding operation of the column address, and
   word lines driven by the row selecting signal and column selecting signal lines for outputting the column selecting signal are arranged parallel to each other, so as to supply these signals to the memory block of the target memory cell and to access the memory cell.

7. A semiconductor memory device as claimed in claim 6, wherein the column pre-decoded signal is supplied to the area where the sense amplifier is provided, for each bank.

8. A semiconductor memory device having a plurality of memory blocks, each block including a plurality of memory banks, wherein a target memory cell in the memory blocks is accessed according to an input bank address, row address, and column address, the semiconductor memory device comprising:
   a row decoding section for decoding the row address so as to generate a row selecting signal; and
   a column pre-decoding section for pre-decoding the column address so as to generate 2-party column pre-decoded signals; and
   a column decoding section, provided in an area of the memory block where a sense amplifier for sensing the memory cell is provided, for performing the main decoding operation of the column address based on the column pre-decoded signals, and selecting the column on the memory block designated by the column address, and
   wherein the area where the sense amplifier is provided is arranged between lines for outputting the 2-party column pre-decoded signals.

9. A semiconductor memory device as claimed in claim 8, wherein the 2-party column pre-decoded signals are supplied to the column selecting section from either side of the column selecting section.

10. A semiconductor memory device as claimed in claim 1, wherein the semiconductor memory device is a DRAM.

11. A semiconductor memory device as claimed in claim 6, wherein the semiconductor memory device is a DRAM.

12. A semiconductor memory device as claimed in claim 8, wherein the semiconductor memory device is a DRAM.

13. A semiconductor memory device as claimed in claim 1, further comprising:

a connecting portion, provided above each memory cell in the memory blocks, for connecting metallic wiring layers.

14. A semiconductor memory device as claimed in claim 13, wherein the connecting portion is provided for connecting each column selecting signal line to a sense amplifier for sensing the memory cell.

15. A semiconductor memory device as claimed in claim 1, wherein:

the target memory cell in the memory blocks is accessed via input/output lines; and the column selecting signal lines and the input/output lines are arranged perpendicular to each other.

* * * * *

UNITED STATES PATENT AND TRADEMARK OFFICE
CERTIFICATE OF CORRECTION

| | |
|---|---|
| PATENT NO. | : 6,282,147 B1 |
| APPLICATION NO. | : 09/528446 |
| DATED | : August 28, 2001 |
| INVENTOR(S) | : Shiro Fujima |

It is certified that error appears in the above-identified patent and that said Letters Patent is hereby corrected as shown below:

Claim 1, at column 19, line 62, change "plain" to --plan.--.

Signed and Sealed this

Thirty-first Day of July, 2007

JON W. DUDAS
*Director of the United States Patent and Trademark Office*